United States Patent
Joshi

(10) Patent No.: US 12,166,458 B2
(45) Date of Patent: Dec. 10, 2024

(54) RADIO FREQUENCY POWER AMPLIFIER AND METHOD FOR MANUFACTURING DOHERTY POWER AMPLIFIER

(71) Applicant: Rachit Joshi, Uttar Pradesh (IN)

(72) Inventor: Rachit Joshi, Uttar Pradesh (IN)

( * ) Notice: Subject to any disclaimer, the term of this patent is extended or adjusted under 35 U.S.C. 154(b) by 620 days.

(21) Appl. No.: 17/496,929

(22) Filed: Oct. 8, 2021

(65) Prior Publication Data

US 2023/0116432 A1   Apr. 13, 2023

(51) Int. Cl.
| | |
|---|---|
| H03F 3/68 | (2006.01) |
| H03F 1/02 | (2006.01) |
| H03F 1/56 | (2006.01) |
| H03F 3/191 | (2006.01) |
| H03F 3/24 | (2006.01) |
| H03F 3/21 | (2006.01) |

(52) U.S. Cl.
CPC ........... *H03F 3/245* (2013.01); *H03F 1/0288* (2013.01); *H03F 1/56* (2013.01); *H03F 3/211* (2013.01); *H03F 2200/222* (2013.01); *H03F 2200/451* (2013.01)

(58) Field of Classification Search
CPC .......... H03F 3/245; H03F 1/0288; H03F 1/56; H03F 2200/222; H03F 2200/451; H03F 3/68; H03F 3/211; H03F 3/602; H03F 3/195; H03F 3/191; H03F 1/565

USPC ...................................... 330/124 R, 295, 302
See application file for complete search history.

(56) References Cited

U.S. PATENT DOCUMENTS

| | | | |
|---|---|---|---|
| 7,161,434 B2 * | 1/2007 | Rhodes | H03F 3/217 330/306 |
| 7,741,907 B2 * | 6/2010 | Takagi | H03F 3/217 330/251 |
| 8,228,123 B2 | 7/2012 | Blednov | |
| 9,083,291 B2 * | 7/2015 | Lender, Jr. | H03F 3/195 |
| 9,673,766 B1 * | 6/2017 | Roberts | H03F 1/565 |
| 10,784,822 B2 * | 9/2020 | Zhu | H01L 23/4952 |
| 11,463,055 B2 | 10/2022 | Li et al. | |
| 11,469,711 B2 | 10/2022 | Samata | |
| 2020/0304074 A1 | 9/2020 | Jang et al. | |
| 2020/0373892 A1 | 11/2020 | Kim et al. | |

* cited by examiner

*Primary Examiner* — Khanh V Nguyen
(74) *Attorney, Agent, or Firm* — WPAT, P.C

(57) ABSTRACT

The present disclosure provides a RF power amplifier and a method for manufacturing a Doherty power amplifier. The RF power amplifier includes at least one transistor, a harmonic termination circuit, and an impedance inverter. The harmonic termination circuit has one terminal directly connected to the drain electrode of the transistor and contributes as a part of a harmonic matching network for the transistor at the second harmonic and/or the third harmonic of the fundamental frequency. The impedance inverter is configured to perform impedance inversion of a static load or a modulated load at the fundamental frequency without affected by the harmonic termination circuit.

57 Claims, 18 Drawing Sheets

RADIO FREQUENCY POWER AMPLIFIER AND METHOD FOR MANUFACTURING DOHERTY POWER AMPLIFIER

TECHNICAL FIELD

The disclosed embodiments relate to the features of radio frequency (RF) circuit design and manufacturing method thereof. More particularly, the disclosed embodiments describe various improvements for RF power amplifier and method for manufacturing Doherty power amplifier.

BACKGROUND OF INVENTION

The increasing demand for the high efficiency power amplifier at back off is typically the need for the upcoming 5G MIMO applications. Also, having a high bandwidth is a typical requirement for 5G and other standards for high-speed data transmission for cellular applications. Conventional switch mode Doherty power amplifiers has been quite popular for providing good back off efficiency using harmonic load terminations (class F, $F^{-1}$, etc) but it has a major limitation in terms of bandwidth which comes from using the narrowband quarter wave transmission line.

A lot of ways were developed to address the bandwidth limitation and one approach was using device parasitic compensation. However, it failed to incorporate harmonic load terminations for having a very high efficiency. So, in summary, the currently used Doherty power amplifiers in the industries usually have trade-offs with high efficiency and high bandwidth when it comes to using the parasitic compensation technique. As explained before, while some were able to provide excellent bandwidth using the device parasitic but they could not provide harmonic termination for high efficiency (using switch mode power amplifiers) probably because of difficulty of designing harmonic network and size complications. Similarly, others were able to provide excellent efficiency by using device parasitic for harmonic load terminations (switch mode power amplifiers) but they suffer from bandwidth limitation due to device parasitic while using external quarter wave Transmission line and offset lines which further reduce bandwidth, with bulky size which fails miniaturization and integration purposes.

So, the typical Doherty power amplifier using harmonic matching network employing Switch Mode power amplifier topology using at least two harmonics frequencies, achieve high efficiency but with low bandwidth (narrowband design) and bulky size. Such design is not practical for Monolithic Microwave Integrated Circuits (MMIC) or Hybrid Integrated Circuits (IC) applications due to the large size required by using the harmonic termination network, offset lines and fundamental matching network required for both main and peaking amplifier. So, there is a need for a new type of Doherty power amplifier which can achieve high efficiency using at least two harmonic load terminations, without making the circuit complex and bulky, and providing sufficiently high bandwidth for Monolithic microwave Integrated Circuits (MMIC), hybrid IC or even for discrete RF applications. The present invention attempts to provides the said novel Doherty power amplifier by using novel connecting network called hybrid Integrated Matching Networks, to be incorporated in industries for all sort of RF applications. Although the present invention focusses on application of hybrid Integrated Matching Network for Doherty power amplifiers but they can also be used for general purpose switch Mode and continuous Mode RF power amplifier such as class F, class $F^{-1}$, class J, class E, continuum class F, continuum class $F^{-1}$, continuum class J, class E and other continuum switch mode RF power amplifiers employing harmonic load terminations.

SUMMARY

The embodiments provided by the present disclosure solves the narrow bandwidth issues of switch mode RF power amplifiers by using impedance inverting network instead of using fundamental matching network, and also absorbing the device parasitic for load harmonic terminations.

The embodiments provided by the present disclosure also achieves effective circuit miniaturization for switch Mode RF power amplifiers.

The embodiments provided by the present disclosure also solves major problems with the current Doherty power amplifiers used in the industries. The problem like trade-off between high bandwidth and high efficiency. There is also a trade-off between high efficiency and size miniaturization. Present invention resolves this trade off by providing not only very high efficiency at back off but also providing a wide bandwidth at the same time along with size miniaturization.

The embodiments provided by the present disclosure also solves the design complications and size problems which often comes from while trying to realize a proper switch mode Doherty power amplifier using both second and third harmonic load terminations for Switch Mode power amplifier designs.

The present disclosure provides A radio frequency (RF) power amplifier operated at a fundamental frequency and configured to electrically connect a load, comprising: at least one transistor; and a hybrid integrated matching circuit, electrically connected between a drain electrode of the at least one transistor and the load, wherein the hybrid integrated matching circuit comprises: a first circuit, having a first terminal electrically connected to the drain electrode of the at least one transistor and a second terminal electrically connected to the load; and a second circuit, electrically connected between the drain electrode of the at least one transistor and a RF ground, wherein at the fundamental frequency, the first circuit and an output parasitic component of the at least one transistor operate as an impedance inverter of the RF power amplifier, while the second circuit presents a high impedance path relative to the RF ground at the fundamental frequency, and wherein the second circuit is configured to present an impedance relative to the RF ground such that one of a high impedance and a low impedance is observed from an intrinsic plane of the at least one transistor at a first target harmonic of the fundamental frequency to terminate the first target harmonic.

The present disclosure provides a method for manufacturing a Doherty power amplifier, comprising: providing at least one main amplifier operated at a fundamental frequency; providing at least one peaking amplifier connected to the main amplifier in parallel; connecting a first circuit between output terminals of the at least one main amplifier and the at least one peaking amplifier; connecting a second circuit between the output terminal of the main amplifier and a RF ground; connecting a third circuit between the output terminal of the peaking amplifier and the RF ground; determining the size and the type of components included in the first circuit so as to design impedance inverting network using an output parasitic component of at least one of the main amplifier and the peaking amplifier at the fundamental frequency; determining the size of components included in the second circuit and the third circuit so that the second circuit and the third circuit presents a high impedance relative to the RF ground at the fundamental frequency hence not affecting the functioning of impedance inverting network; determining the size of the components included in the second circuit and the third circuit so as to terminate one of a second harmonic and a third harmonic of the fundamental frequency by using at least the first circuit, the second circuit, and the third circuit presenting impedances such that one of a low impedance and a high impedance is observed from an intrinsic plane of the main amplifier and peaking amplifier corresponding to that harmonic frequency; and determining the size of the components included in the, the second circuit and the third circuit so as to terminate the other one of the second harmonic and the third harmonic of the fundamental frequency by using at least the first circuit, the second circuit, and the third circuit presenting impedances such that one of a high impedance and a low impedance is observed from the intrinsic plane of the main amplifier and peaking amplifier corresponding to that harmonic frequency.

The present disclosure provides a RF power amplifier operated at a fundamental frequency and configured to electrically connect a load, comprising: at least one transistor; a harmonic termination circuit, having one terminal directly connected to the drain electrode of the at least one transistor and the other end electrically connected to a RF ground, wherein the harmonic termination circuit contributes as a part of a harmonic matching network for the at least one transistor at least one of the second harmonic and the third harmonic of the fundamental frequency; and an impedance inverter, having a first terminal electrically connected to the drain electrode of the at least one transistor and a second terminal electrically connected to the load, and configured to perform impedance inversion of a static load or a modulated load at the fundamental frequency without affected by the harmonic termination circuit.

BRIEF DESCRIPTION OF THE FIGURES

In order to explain more clearly the technical solution in the present embodiment, the following is a brief introduction of the drawings described in the embodiments. Obviously, the drawings described below are only some embodiments of the present application. For the person having ordinary skill in the art, other drawings can be obtained from these drawings without any creative effort.

DETAILED DESCRIPTION OF EMBODIMENTS

Figure 1A:
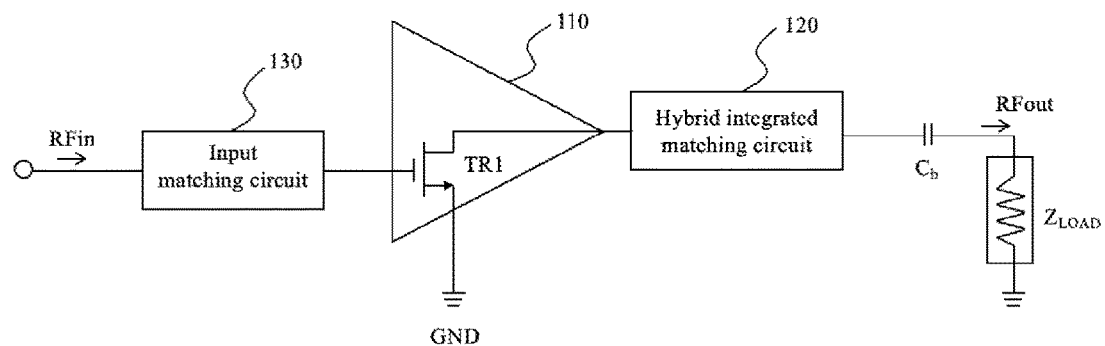
FIG. 1A is a block diagram of a RF power amplifier according to some exemplary embodiments of the present disclosure.

The present disclosure provides a novel RF power amplifier and a method for manufacturing a Doherty power amplifier. The present disclosure will now be described in the following embodiments with reference to the drawings. The following descriptions of various embodiments of this invention are presented herein for purpose of illustration and giving examples only. It is not intended to be exhaustive or to be limited to the precise form disclosed. These example embodiments are just that—examples—and many implementations and variations are possible that do not require the details provided herein. It should also be emphasized that the disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the invention.

In the drawings, the size and relative sizes of components may be exaggerated for clarity. Like numbers refer to like elements throughout.

The terminology used herein is for the purpose of describing particular embodiments only and is not intended to be limiting of the invention. As used herein, the singular forms "a", "an" and "the" are intended to include the plural forms as well, unless the context clearly indicates otherwise. As used herein, the term "and/or" includes any and all combinations of one or more of the associated listed items and may be abbreviated as "/".

It will be understood that, although the terms first, second, third etc. may be used herein to describe various elements, components, or circuits, these elements, components, and/or circuits should not be limited by these terms. Unless the context indicates otherwise, these terms are only used to distinguish one element, component, or circuit from another element, component, or circuit, for example as a naming convention. Thus, a first element, component, or circuit discussed below in one section of the specification could be termed a second element, component, or circuit in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that when a component is referred to as being "connected" or "coupled" to or "on" another component, it can be directly connected or coupled to or on the other component or intervening components may be present. In contrast, when a component is referred to as being "directly connected" or "directly coupled" to another component, there are no intervening components present. Other words used to describe the relationship between elements should be interpreted in a like fashion (e.g., "between" versus "directly between," "adjacent" versus "directly adjacent," etc.).

As used herein, items described as being "electrically connected" are configured such that an electrical signal can be passed from one item to the other at least at some circumstances. Therefore, a passive electrically conductive component (e.g., a wire, pad, internal electrical line, etc.) physically connected to a passive electrically insulative component (e.g., a prepreg layer of a printed circuit board, an electrically insulative adhesive connecting two devices, an electrically insulative underfill or mold layer, etc.) is not electrically connected to that component.

As used herein, the terms "network" and "circuit" are interchangeable in the present disclosure, where the term "circuit" is more likely referred to describe from the perspective of physical and electrical connection and arrangement among the components, and the term "network" is more likely referred to describe equivalent topologies between an input port and an output port.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

Embodiments may be described, and illustrated in the drawings, in terms of functional blocks, units and/or modules. Those skilled in the art will appreciate that these blocks, units and/or modules are physically implemented by electronic (or optical) circuits such as logic circuits, discrete components, analog circuits, hard-wired circuits, memory elements, wiring connections, and the like, which may be formed using semiconductor-based fabrication techniques or other manufacturing technologies. Each block, unit and/or module of the embodiments may be physically separated into two or more interacting and discrete blocks, units and/or modules. Further, the blocks, units and/or modules of the various embodiments may be physically combined into more complex blocks, units and/or modules.

FIG. 1A is a block diagram of a RF power amplifier according to some exemplary embodiments of the present disclosure. Refer to FIG. 1A, the RF power amplifier 100 could be a switch mode RF power amplifier designed for operating at a fundamental frequency, ranging from 0.3 GHz to 3000 GHz, and configured to electrically connect a load $Z_{LOAD}$ for providing amplified RF signal to drive the load $Z_{LOAD}$. In some embodiments, the fundamental frequency could be the frequency using in 4G or 5G MIMO application, or any other frequency used in other applications (X band, Ka band, Ku Band, etc).

The RF power amplifier 100 includes a transistor-based amplifier 110 and a hybrid integrated matching circuit 120, in which the amplifier 110 includes a transistor TR1. The transistor TR1 is biased to amplify an input RF signal RFin received from the gate electrode and to output an amplified signal through the drain electrode. In the present embodiment, FIG. 1A depicts the amplifier 110 is a single stage amplifier as an example, and therefore the gate electrode of the transistor TR1 can be referred to the input terminal of the amplifier 110 and the drain electrode of the transistor TR1 can be referred to the output terminal of the amplifier 110, but the invention is not limited thereto. In some embodiments, the amplifier 110 can be a multi-stage amplifier including two or more transistors, which will be further explained in other embodiments of the present disclosure.

The hybrid integrated matching circuit 120 is electrically connected between the drain electrode of the transistor TR1 and the load $Z_{LOAD}$ and configured to transform the output impedance of the transistor TR1 to match with the impedance of the load $Z_{LOAD}$ at the fundamental frequency and also at the harmonic frequencies, such as the second harmonic frequency (hereinafter "$2^{nd}$ harmonic") and/or third harmonic frequencies (hereinafter "$3^{rd}$ harmonic").

Figure 1B:
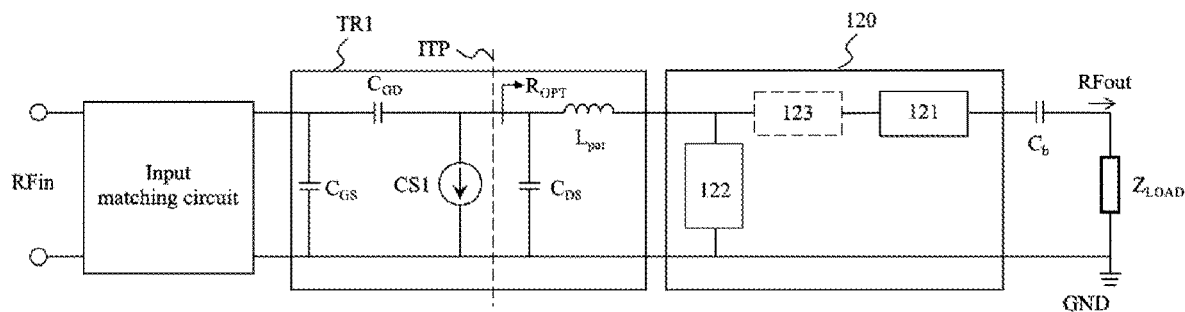
FIG. 1B is an equivalent circuit diagram of a RF power amplifier according to some exemplary embodiments of FIG. 1A.

Further refer to FIG. 1A and FIG. 1B, in which FIG. 1B is an equivalent circuit diagram of a RF power amplifier according to some exemplary embodiments of FIG. 1A. In the present embodiment, the transistor TR1 is illustrated as an equivalent model including a current source CS1 and parasitic components between electrodes, for example, parasitic capacitances $C_{GD}$, $C_{GS}$, and $C_{DS}$ and a parasitic inductance $L_{par}$.

The hybrid integrated matching circuit 120 includes a first circuit 121 and a second circuit 122. The first circuit 121 has a first terminal electrically connected to the drain electrode of the transistor TR1 and a second terminal electrically connected to the load $Z_{LOAD}$. The second circuit 122 is electrically connected between the drain electrode of the transistor TR1 and the RF ground GND.

The first circuit 121 and the output parasitic components $C_{DS}$ and $L_{par}$ operate as an impedance inverter of the RF power amplifier 100, which provides impedance inverting network at the fundamental frequency, while the second circuit 122 presents a high impedance path relative to the RF ground GND at the fundamental frequency.

The second circuit 122 is configured to present an impedance relative to the RF ground GND such that the output impedance $R_O$, which is observed from the intrinsic plane ITP of the transistor TR1, is a high impedance or a low impedance at a first target harmonic of the fundamental frequency to terminate the first target harmonic. In the present embodiment, the first target harmonic can be the $2^{nd}$ harmonic, the $3^{rd}$ harmonic, or any other harmonic frequencies, the present invention is not limited thereto.

To be specific, the hybrid integrated matching circuit 120 forms the impedance inverting network at the fundamental frequency by using the first circuit 121 along with the parasitic components $C_{DS}$ and $L_{par}$ of the transistor TR1, while the second circuit 122 acts as an open circuit or can be regarded as electrically disconnected to the RF power amplifier 100 since the second circuit 122 presents a high impedance relative to the RF ground GND. The hybrid integrated matching circuit 120 further forms the harmonic matching network at the target harmonic by using the parasitic components $C_{DS}$ and $L_{par}$ of the transistor TR1, the first circuit 121, and the second circuit 122.

In other words, the first circuit 121 and the parasitic components $C_{DS}$ and $L_{par}$ of the transistor TR1 components contribute as a part of both the impedance inverting network and the harmonic matching network. The second circuit 122 is mainly used as a harmonic terminating circuit to contribute as a part of the harmonic matching network at the target harmonic. That is to say, the impedance inverting network and the harmonic matching network share the parasitic components $C_{DS}$ and $L_{par}$ and the first circuit 121 and there is no single circuit in the hybrid integrated matching circuit 120 that can provide the impedance inverting network or the harmonic matching network on its own, neither the first circuit 121 nor the second circuit 122. Since the output parasitic capacitance $C_{DS}$, the output parasitic inductance $L_{par}$, the first circuit 121, and the second circuit 122 are all merged together to become a part of the impedance inverting network and the harmonic matching network at different frequencies, the impedance inverting network and the harmonic matching network can be regarded as being "hybrid integrated".

From another perspective of view, the hybrid integrated matching circuit can be referred to any output matching network which uses the transistor output parasitic capacitance and inductance for accomplishing both impedance inversion and also providing one or two harmonic load terminations (e.g., $2^{nd}$ harmonic and $3^{rd}$ harmonic loads). This creates a hybrid structure where all the transistor parasitic, the impedance inverting network and the harmonic matching network can be merged together into one unit giving a miniaturization design for the RF power amplifier 100.

In addition, the second circuit 122 is equivalent to an open circuit which does not affect the impedance inverting network at the fundamental frequency. In other words, at the fundamental frequency, the output impedance $R_O$ is substantially irrelevant to the impedance presented by the second circuit relative to the RF ground.

In some embodiments, the second circuit 122 is further configured to present an impedance relative to the RF ground GND such that the output impedance $R_O$ is a high impedance or a low impedance at a second target harmonic so as to terminate the second target harmonic. Similarly, the second target harmonic can be the $2^{nd}$ harmonic, the $3^{rd}$ harmonic, or any other harmonic frequencies, which is different from the first target harmonic, the present invention is not limited thereto.

More specifically, the second circuit 122 can be designed for modulating the harmonic impedance (or terminating the harmonic effect) at multiple harmonic frequencies, so that the high efficiency switch mode power amplifier topology, such as class F, class $F^{-1}$, class J, class S, etc., can be achieved. For example, the second circuit 122 can be designed for causing the output impedance $R_O$ is a high impedance at the $2^{nd}$ harmonic and a low impedance at the $3^{rd}$ harmonic, so that the transistor TR1 can operate in class $F^{-1}$ mode. For another example, the second circuit 122 can be designed for causing the output impedance $R_O$ is a low impedance at the $2^{nd}$ harmonic and a high impedance at the $3^{rd}$ harmonic, so that the transistor TR1 can operate in class F mode. For yet another example, the second circuit 122 can be designed for causing the output impedance $R_O$ is a high impedance at the $2^{nd}$ harmonic while the $3^{rd}$ harmonic impedance is not terminated, so that the transistor TR1 can operate in partial inverse class F mode.

In some embodiments, the impedance inverting network provided by the hybrid Integrated matching circuit 120 can be any low pass impedance inverting transformer using at least one shunt type reactance. For example, by selecting the proper topology of the first circuit 121, the impedance inverting network can be a low pass $n^{th}$ stage lumped quarter wave transformer, a low pass $n^{th}$ stage reduced length quarter wave transmission line, a quasi-lumped $n^{th}$ order low pass filter, a quasi-lumped $n^{th}$ order low pass quarter wave transformer, a quasi-lumped low pass Chebyshev transformer, a quasi-lumped low pass Chebyshev quarter wave transformer, quasi-lumped low pass quarter wave stepped impedance transformer, or a quasi-lumped low pass quarter wave stepped impedance quarter wave transformer.

It should be noted that, the impedance inverting network is not necessary to present on the circuit board physically and entirely since the parasitic capacitance $C_{DS}$/parasitic inductance $L_{par}$ is used as a part of the impedance inverting network. In other words, a RF power amplifier without a fully visible impedance inverting network does not necessary mean that the RF power amplifier falls out of the claim scope. As long as the claimed elements can read on the equivalent circuit of the RF power amplifier, the power amplifier still falls into the scope intended to cover by the present invention.

In some embodiments, the second circuit 122 can be disposed adjacent and directly connected to the drain electrode of the transistor TR1, which means there is a component in the second circuit 122 is physically disposed closest and directly connected to the drain electrode of the transistor TR1 compared to other components in the hybrid integrated matching circuit 120.

In some embodiments, the RF power amplifier 100 further includes an input matching circuit 130 electrically connected to the input terminal of the amplifier 110 and configured to transmit the input RF signal RFin, received from a power source, to the input terminal of the amplifier 110. From another perspective of view, the input matching circuit 130 is electrically connected to the gate electrode of the transistor TR1 and transmits the input RF signal RFin to the gate electrode of the transistor TR1.

In some embodiments, the RF power amplifier 100 further includes a DC block capacitor Cb electrically connected between the hybrid integrated matching circuit 120 and the load $Z_{LOAD}$ and configured to prevent the DC signal from entering the load $Z_{LOAD}$.

In some embodiments, the hybrid integrated matching circuit 120 further includes a compensation circuit 124. The compensation circuit 124 is electrically connected between the first circuit 121 and the second circuit 122 and configured to compensate the harmonic matching network.

In some embodiments, the compensation circuit 123 can be implemented by a LC resonator configured to resonate at the fundamental frequency and to correct improper harmonic load terminations. The compensation circuit 123 can be used for any RF power amplifier employing one or two harmonic load terminations.

In some embodiments, the hybrid Integrated matching circuit 120 can be used on III-V (GaAs or InP or GaN), Si, SoI, CMOS, SiGe and various other semiconductor technology platform for RFIC, RF HYBRID IC or RF discrete applications.

In some embodiments, the transistor TR1 can be made of a semiconductor material having relatively large fundamental impedance at intrinsic plane. For example, GaN.

In some embodiments, part of the passive components included in the hybrid integrated matching circuit 120 can be done on MMIC and another part of the passive components can be done in the discrete substrate such as PCB, laminate, etc board.

In some embodiments, the hybrid Integrated matching circuit 120 can also be used for pure discrete RF switch mode power amplifier and Doherty power amplifiers.

Figure 2A:
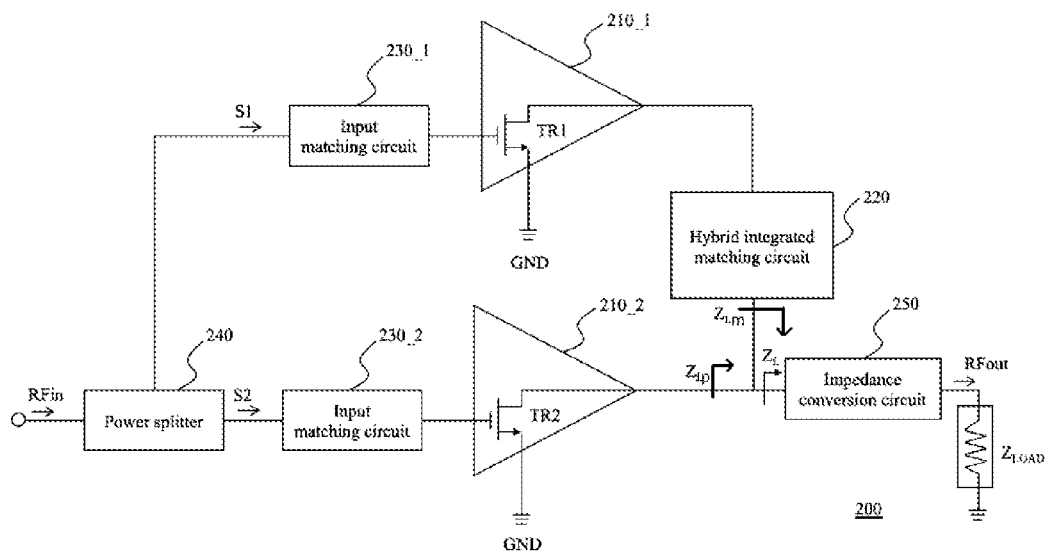
FIG. 2A is a block diagram of a RF power amplifier having multiple transistors according to some exemplary embodiments of the present disclosure.
Figure 2B:
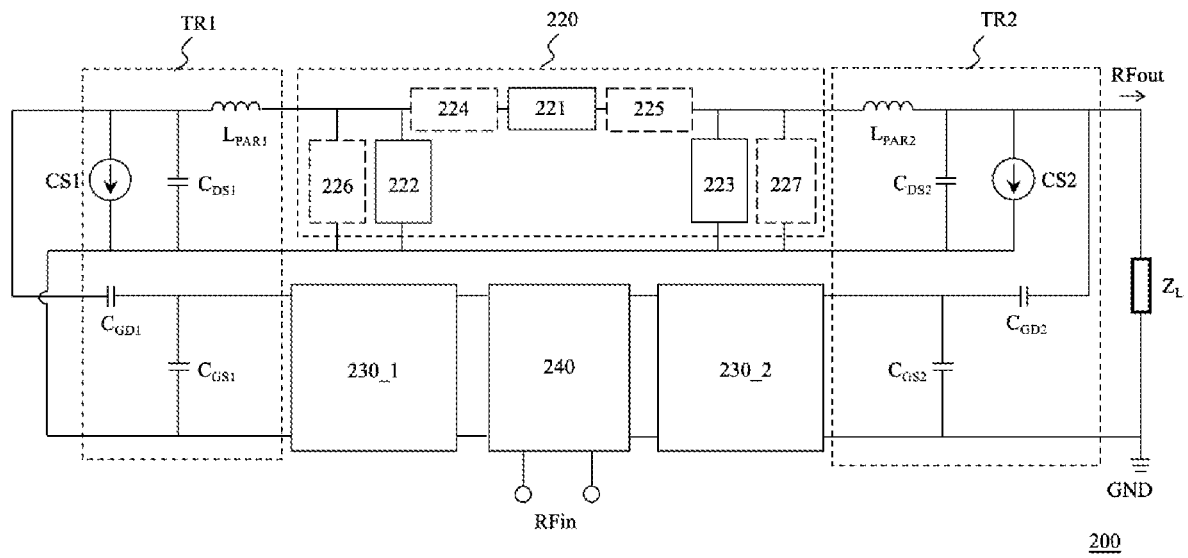
FIG. 2B is an equivalent circuit diagram of a RF power amplifier according to some exemplary embodiments of FIG. 2A.

The exemplary embodiments of the RF power amplifier having multiple transistors are illustrated as shown in FIGS. 2A and 2B, in which FIG. 2A is a block diagram of a RF power amplifier having multiple transistors according to some exemplary embodiments of the present disclosure, and FIG. 2B is an equivalent circuit diagram of a RF power amplifier according to some exemplary embodiments of FIG. 2A.

Refer to FIG. 2A, the RF power amplifier 200 includes two stage transistor-based amplifiers 210_1 and 210_2 and a hybrid integrated matching circuit 220. The amplifiers 210_1 and 210_2 are similar to the amplifier 110 described in FIGS. 1A and 1B and respectively include a first transistor TR1 and a second transistor TR2. The second transistor TR2 is electrically connected to the first transistor TR1 in parallel through the hybrid integrated matching circuit 220, in which the first transistor TR1 and the second transistor TR2 are configured to share the load $Z_{LOAD}$. From the perspective of the hybrid integrated matching circuit 220, the hybrid integrated matching circuit 220 has a terminal electrically connected to the first transistor TR1 and the other terminal electrically connected to the second transistor TR2 and also to the load $Z_{LOAD}$. From the perspective of the equivalent circuit, the first transistor TR1 and the second transistor T2 can also refer to share the common load $Z_L$, which could be different from the impedance of the load $Z_{LOAD}$ (normally a static load with 50 ohm). Both the load $Z_{LOAD}$ and the common load $Z_L$ are referred to "load" in the following description.

In some embodiments, the RF power amplifier 200 can be referred to a Doherty power amplifier (hereinafter "Doherty power amplifier 200"), in which the amplifier 210_1 can be referred to the main amplifier (hereinafter "main amplifier 210_1") for the Doherty power amplifier and the amplifier 210_2 can be referred to the peaking amplifier (hereinafter "peaking amplifier 210_2") for the Doherty power amplifier. From the perspective of the transistor level, the first transistor TR1 can be referred to the main transistor (hereinafter "main transistor TR1") and the second transistor TR2 can be referred to the peaking transistor (hereinafter "peaking transistor TR2"). In order to clearly explain the connection relationship between the components, the following are described in terms of transistors. People having ordinary skill in the art may understand the correspondence between the amplifier and the transistor thereof by referring the disclosed embodiments.

The hybrid integrated matching circuit 220 is configured to transform the output impedance Rom of the main transistor TR1 and the output impedance $R_{Op}$ of the peaking transistor TR2 to match with the impedance of the modulated load $Z_{Lm}$ and $Z_{Lp}$ for the main and peaking amplifier 210_1 and 210_2 respectively, at the fundamental frequency and also at the harmonic frequencies. Herein, the output impedance Rom of the main transistor TR1 is the impedance observed from the intrinsic plane ITPm of the main transistor TR1, and the output impedance $R_{Op}$ of the peaking transistor TR2 is the impedance observed from the intrinsic plane ITPp of the peaking transistor TR2. In addition, hybrid integrated matching circuit 220 further provides the phase shift, for example around 90 degrees, to the output signal of the main transistor TR1. It should be noted that, people having ordinary skill in the art may understand the phase shift does not need to be exactly and always 90 degrees and can differ as well.

The Doherty power amplifier 200 can further include input matching circuits 230_1 and 230_2, a power splitter 240, and an impedance conversion circuit 250. The input matching circuits 230_1 and 230_2 are respectively connected to the gate electrodes of the main transistor TR1 and the peaking transistor TR2. The function and operation of the input matching circuits 230_1 and 230_2 are similar to that of in FIG. 1A, and thus not repeated herein.

However, note that the input matching circuits 230_1 and 230_2 can also be used for providing phase shift of around 90 degrees between the input signals S1 and S2 to compensate the phase shift provided by the hybrid Integrated Matching circuit 220 between the output signals from transistor TR1 and TR2 and the present invention is not limited thereto.

The power splitter 240 is electrically connected to the input terminals of the input matching circuits 230_1 and 230_2 and configured to convert the input RF signal RFin into two signals S1 and S2 having phase difference to compensate the phase shift provided by the hybrid integrated matching circuit 220. For example, the signal S2 may have around 90 degrees phase delay compared to signal S1, and signal S1 may have the same phase with the input RF signal RFin. In some embodiments, the power splitter 240 can be a 90-degree Hybrid splitter, a Wilkinson power splitter, or a simple direct input power splitter, etc., but the present invention is not limited thereto.

In some embodiments, the power splitter 240 can use even or uneven input power splitting. The uneven input power splitting is done so that more power is given to the peaking transistor TR2 during load modulation and less power is given to the peaking transistor TR2 when the peaking transistor TR2 is open and no-load modulation takes place. The uneven input power splitting is used when the main transistor TR1 and the peaking transistor TR2 are sized as a symmetrical Doherty power amplifier. Even input power splitting on the other hand can be used when the sizes of the main transistor TR1 and the peaking transistor TR2 are quite different, for asymmetrical Doherty power amplifier (typically size of the peaking transistor TR2 is twice the size of the main transistor TR1), but the present invention is not limited thereto.

The impedance conversion circuit 250 has one end electrically connected to the peaking transistor TR2 and the hybrid integrated matching circuit 220 and the other end electrically connected to the load $Z_{LOAD}$. The impedance conversion circuit 250 is configured to transform the load $Z_{LOAD}$, which is typically 50 ohms, to the load $Z_L$ having the impedance of half of the fundamental impedance of the main transistor TR1. In some embodiments, the impedance conversion circuit 250 can be, for example, a simple LC network or distributed quarter wave transmission line, or lumped or reduced length quarter wave transmission line with characteristic impedance equals to $$\sqrt{\frac{Z_{LOAD} * R_{OPT}}{2}}.$$

Further refer to FIG. 2A and FIG. 2B, the main transistor TR1 and the peaking transistor TR2 have the equivalent model similar to the transistor TR1 shown in FIG. 1B. The main transistor TR1 includes a current source CS1, parasitic capacitances $C_{GD1}$, $C_{GS1}$, and $C_{DS1}$, and a parasitic inductance $L_{par1}$. The peaking transistor TR2 includes a current source CS2, parasitic capacitances $C_{GD2}$, $C_{GS2}$, and $C_{DS2}$, and a parasitic inductance $L_{par2}$. In addition, the load $Z_L$ can be referred to the common load shared by the main transistor TR1 and the peaking transistor TR2.

In the present embodiment, the hybrid integrated matching circuit 220 includes a first circuit 221 and at least one of a second circuit 222 and a third circuit 223, depending on the topology of the hybrid integrated matching circuit 220 is applied. To be specific, the hybrid integrated matching circuit 220 can be further divided into the fully hybrid topology and one-side hybrid topology. The fully hybrid integrated matching circuit 220 refers to the parasitic components from both the main transistor TR1 and the peaking transistor TR2 are used as a part of the impedance inverting network, the relevant embodiments will be further described in detail in FIGS. 5A-7D. The one-side hybrid integrated matching circuit 220 refers to the parasitic component from only one of the main transistor TR1 and the peaking transistor TR2 is used as a part of the impedance inverting network, while the parasitic component from the other one of the main transistor TR1 and the peaking transistor TR2 will be cancelled or omitted, the relevant embodiments will be further described in detail in FIGS. 8A-10C.

If the fully hybrid topology is used, the fully hybrid integrated matching circuit 220 includes the first circuit 221 and both the second circuit 222 and the third circuit 223. The first circuit 221 has a first terminal electrically connected to the drain electrode of the main transistor TR1 and a second terminal electrically connected to the drain electrode of the peaking transistor TR2 and also to the load $Z_L$. The first terminal and the second terminal of the first circuit 221 are further connected to the second circuit 222 and the third circuit 223, respectively. The second circuit 222 is electrically connected between the drain electrode of the main transistor TR1 and the RF ground GND. The third circuit 223 is electrically connected between the drain electrode of the peaking transistor TR2 and the RF ground GND.

The first circuit 221, the output parasitic components $C_{DS1}$ and $L_{par1}$ of the main transistor TR1, and the output parasitic components $C_{DS2}$ and $L_{par2}$ of the peaking transistor TR2 operate as an impedance inverter of the Doherty power amplifier 200, which provides impedance inverting network at the fundamental frequency, while the second circuit 222 and the third circuit 223 respectively present a high impedance path relative to the RF ground GND at the fundamental frequency.

The second circuit 222 presents an impedance relative to the RF ground GND such that the output impedance Rom of the main transistor TR1 is a high impedance or a low impedance at the first target harmonic of the fundamental frequency to terminate the first target harmonic.

The third circuit 223, similar to the second circuit 222, presents an impedance relative to the RF ground GND such that the output impedance $R_{Op}$ of the peaking transistor TR2 is a high impedance or a low impedance at the first target harmonic of the fundamental frequency to terminate the first target harmonic.

In addition, in some embodiments, the second circuit 222 and the third circuit 223 can further present an impedance relative to the RF ground GND, respectively, such that the output impedances Rom and $R_{Op}$ are a high impedance or a low impedance at the second target harmonic of the fundamental frequency to terminate the second target harmonic.

To be specific, the fully hybrid integrated matching circuit 220 forms the impedance inverting network at the fundamental frequency by using the first circuit 121 along with the parasitic components $C_{DS1}$ and $L_{par1}$ of the main transistor TR1 and the parasitic components $C_{DS2}$ and $L_{par2}$ of the peaking transistor TR2, while the second circuit 222 and the third circuit 223 act as an open circuit or can be regarded as electrically disconnected to the RF power amplifier 200 since the second circuit 222 and the third circuit 223 present a high impedance relative to the RF ground GND, respectively.

The hybrid integrated matching circuit 220 further forms the harmonic matching network at the target harmonic by using the parasitic components $C_{DS1}$ and $L_{par1}$ of the main transistor TR1, the parasitic components $C_{DS2}$ and $L_{par2}$, the first circuit 221, the second circuit 222, and the third circuit 223. In other words, the harmonic matching network for the main transistor TR1 can be formed by at least the parasitic component $C_{DS1}/L_{par1}$ of the main transistor TR1, the first circuit 221, and one of the second circuit 222 and the third circuit 223, and the harmonic matching network for the peaking transistor TR2 can be formed by at least the parasitic component $C_{DS2}/L_{par2}$ of the peaking transistor TR2, the first circuit 221, and one of the second circuit and the third circuit.

Compared to the hybrid integrated matching circuit 120 used in the RF power amplifier 100 shown in FIGS. 1A and 1B, the fully hybrid integrated matching circuit 220 further uses the parasitic components from the additional transistor (i.e., peaking transistor TR2) as a part of the impedance inverting network at the fundamental frequency and the harmonic matching network at one or more harmonic frequencies.

In some embodiments, the second circuit 222 and the third circuit 223 include the same circuit topology.

If the one-side hybrid topology is used, the one-side hybrid integrated matching circuit 220 includes the first circuit 221, the second circuit 222, the third circuit 223, and only one of the parasitic cancellation circuit 226/227. The similar part of the one-side hybrid integrated matching circuit 220 can refer to the embodiments of the fully hybrid integrated matching circuit 220 described above, which will be not further repeated herein.

In the embodiment of using the one-side hybrid topology, the second circuit 222 is electrically connected between the drain electrode of one of the main transistor TR1 and the peaking transistor TR2 and the RF ground GND. The third circuit 223 is electrically connected between the drain electrode of the other one of the main transistor TR1 and the peaking transistor TR2. The parasitic cancellation circuit 226/227 is electrically connected to the drain electrode of the main transistor TR1 or the peaking transistor TR2.

For example, if the parasitic component of the main transistor TR1 is used to form the impedance inverting network, the parasitic cancellation circuit 227 is applied and electrically connected between the drain electrode of the peaking transistor TR2 and the RF ground GND. Therefore, the first circuit 221 can be selected and sized to form the impedance inverting network along with the parasitic capacitance $C_{DS1}$ and the parasitic inductance $L_{par1}$ of the main transistor TR1. The parasitic capacitance $C_{DS2}$ and the parasitic inductance $L_{par1}$ can be omitted from the impedance inverting network since the parasitic components are effectively cancelled out by the parasitic cancellation circuit 227. In this example, the impedance inverting network can be regarded as equal to that of illustrated in FIGS. 1A and 1B.

For another example, if the parasitic component of the peaking transistor TR2 is used to form the impedance inverting network, the parasitic cancellation circuit 226 is applied and electrically connected between the drain electrode of the main transistor TR1 and the RF ground GND. Therefore, the first circuit 221 can be selected and sized to form the impedance inverting network along with the parasitic capacitance $C_{DS2}$ and the parasitic inductance $L_{par2}$ of the peaking transistor TR2. The parasitic capacitance $C_{DS1}$ and the parasitic inductance $L_{par1}$ can be omitted from the impedance inverting network since the parasitic components are effectively cancelled out by the parasitic cancellation circuit 226.

For the embodiments of the one-side hybrid integrated matching circuit 220, in addition to the parasitic component of the main transistor TR1/the peaking transistor TR2, the first circuit 221, and the second circuit 222, the parasitic cancellation circuit 226/227 also contributes as a part of the harmonic matching network.

It should be noted that, FIG. 2B shows the second circuit 222 and the third circuit 223 are electrically connected to the main transistor TR1 and the peaking transistor TR2, respectively, but the present invention is not limited thereto. In another embodiment, the second circuit 222 can be electrically connected to the drain electrode of the peaking transistor TR2 and the third circuit 223 can be electrically connected to the drain electrode of the main transistor TR1. In still another embodiment, one of the second circuit 222 and the third circuit 223 can be omitted, so that harmonic matching network for only one of the main transistor TR1 and the peaking transistor TR2 is applied.

In some embodiments, the hybrid integrated matching circuit 220 further includes the compensation circuit 224/225. As shown in FIG. 2B, the compensation circuit 224 is electrically connected between the first terminal of the first circuit 221 and the second circuit 222, and the compensation circuit 225 is electrically connected between the second terminal of the first circuit 221 and the third circuit 223. The operation and the function of the compensation circuit 224/225 can refer to those of in FIG. 1B, which will not be repeated herein.

As stated above, the hybrid Integrated matching circuit 120/220 provides load modulation over a wide bandwidth using transistor parasitic for designing the impedance inverting network and also provides multiple harmonic load terminations (e.g., $2^{nd}$ harmonic and $3^{rd}$ harmonic). The high efficiency switch mode topologies like class F, $F^{-1}$, J, etc and also continuous modes class F, $F^{-1}$, J, etc., can be applied to individual main and or peaking amplifiers. In addition, the load $Z_L$ is set to equal to half of the fundamental impedance of the transistor TR1. This further helps the fully hybrid Integrated matching network to have no fundamental matching network, which if used, usually cause bandwidth limitations and it also helps to miniaturize the overall design of the output matching side of the invented Doherty power amplifier.

Accordingly, the RF power amplifier 100/200 of the present disclosure has the advantage of providing both high bandwidth and high efficiency thus solving bandwidth limitation problem for the conventional Doherty power amplifier which comes from the device output parasitic capacitance and inductance and also providing very high efficiency using miniaturized harmonic matching network instead of complex bulky harmonic matching network. In addition, by using transistor output parasitic capacitance and inductance for designing impedance inverting network, the fundamental matching network or offset lines can be omitted, thus solving the bandwidth limitation.

Further, by disposing the second circuit/third circuit which operates as the harmonic termination circuit extremely close and directly connect to the drain electrode of the main transistor/peaking transistor, the output characteristic can be further improved.

Also, the architecture can be significantly reduced using the embodiments of the present disclosure. The present invention is not limited to one main transistor TR1 and one peaking amplifier TR2 but can also incorporates cascade stage of main and peaking amplifiers for high gain applications, which will be further explained later. Also, the hybrid Integrated matching network is not limited to the design shown in the embodiments and can be of any type as long as they satisfy the main idea of this invention which is using the transistor parasitic for providing load modulation and at least one harmonic termination at the same time.

It should be noted that, the harmonic matching network provided by the hybrid integrated matching circuit 120/220 is not limited to include only the above mentioned components. The actual harmonic matching network can include other components not mentioned. For example, the load $Z_{Lm}$ and $Z_{Lp}$ can also be regarded as a part of the harmonic matching network for main amplifier and peaking amplifier, although the load $Z_{Lm}$ and $Z_{Lp}$ have less significance to the harmonic matching network due to weakly coupling.

The compact and miniaturized design for Hybrid Integrated Matching network can be integrated easily for RF Multi-Input and Multi-Output (MIMO) applications and others. In some embodiments of the present disclosure, the passive components of the harmonic matching network can be internally matched within the device and become open circuit at fundamental making the overall circuit design compact and integrated.

In accordance with another aspect of the present invention for Doherty power amplifier connecting network design, the Fully hybrid Integrated matching circuit composed of three different types while the One-Sided hybrid Integrated Matching circuit is composed of four different types, depending on the conditions whether the parasitic output capacitance of the device $C_{DS}$ is higher or lower than the equivalent shunt capacitance $C_O$ or $C_{OT}$ of the low pass π-type lumped or reduced-length quarter wave transmission line acting as impedance inverting network.

In order to make the main function of the circuit can be easily identified, the first circuit 121/221 is referred to an impedance inverter 121/221 hereinafter since the first circuit 121/221 dominates the impedance inverting network at the fundamental frequency, and the second circuit 122/222 and the third circuit 223 are referred to the harmonic termination circuit hereinafter since it provides the harmonic termination network for the target harmonic. It should be noted that, the terms "first circuit" and "impedance inverter" are interchangeable and the terms "second circuit/third circuit" and "harmonic termination circuit" are interchangeable in the present disclosure, however, it not necessarily means the first circuit/impedance inverter is solely for providing the impedance inverting network. As discussed above, the first circuit contributes as a part of both the impedance inverting network and the harmonic matching network.

Figure 3A:
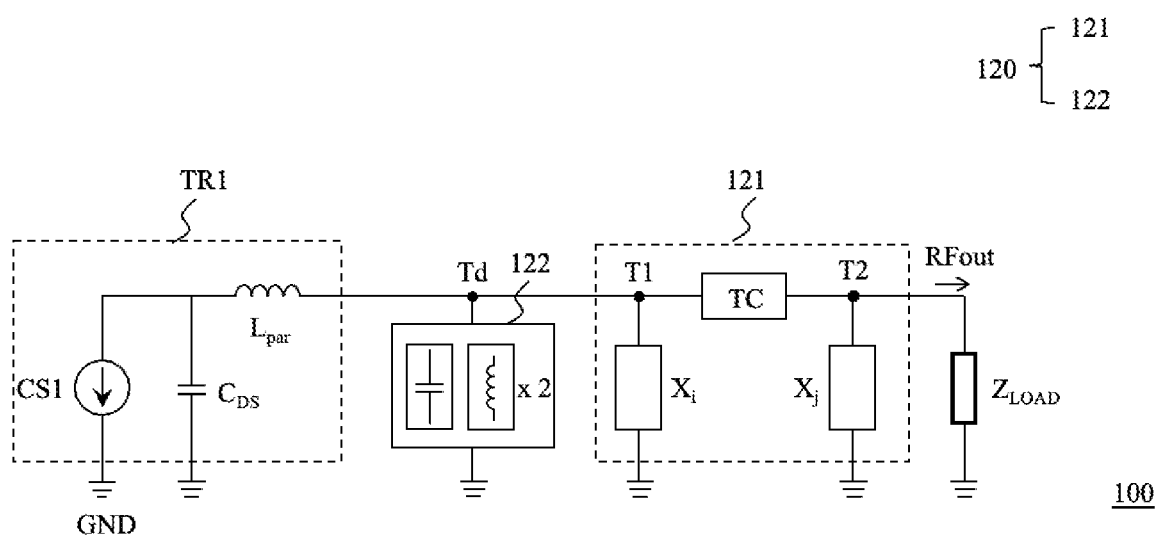
FIGS. 3A-3C are schematic circuit diagrams of a RF power amplifier having a hybrid integrated matching network according to some exemplary embodiments of FIG. 1B.
Figure 3B:
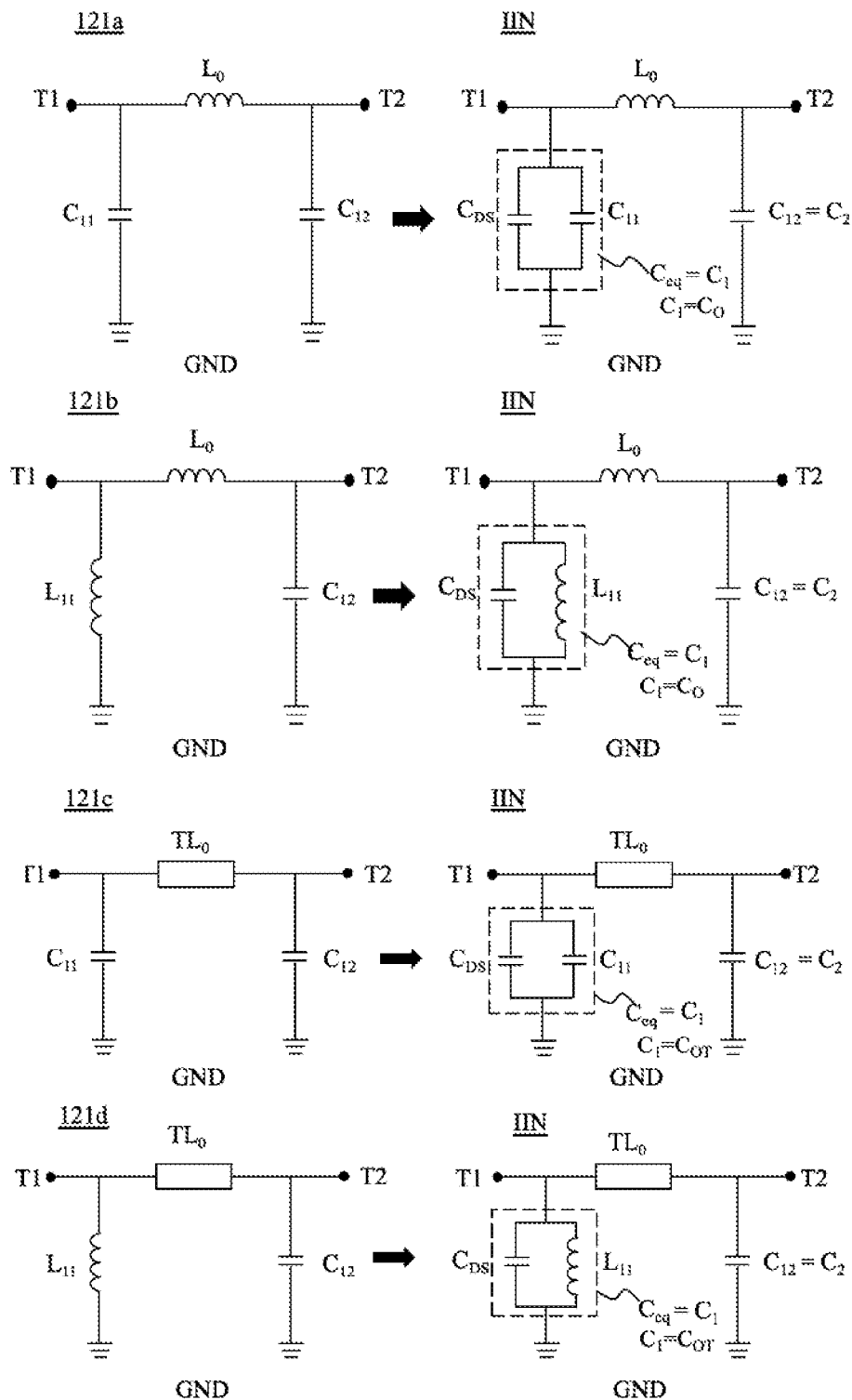
Figure 3C:
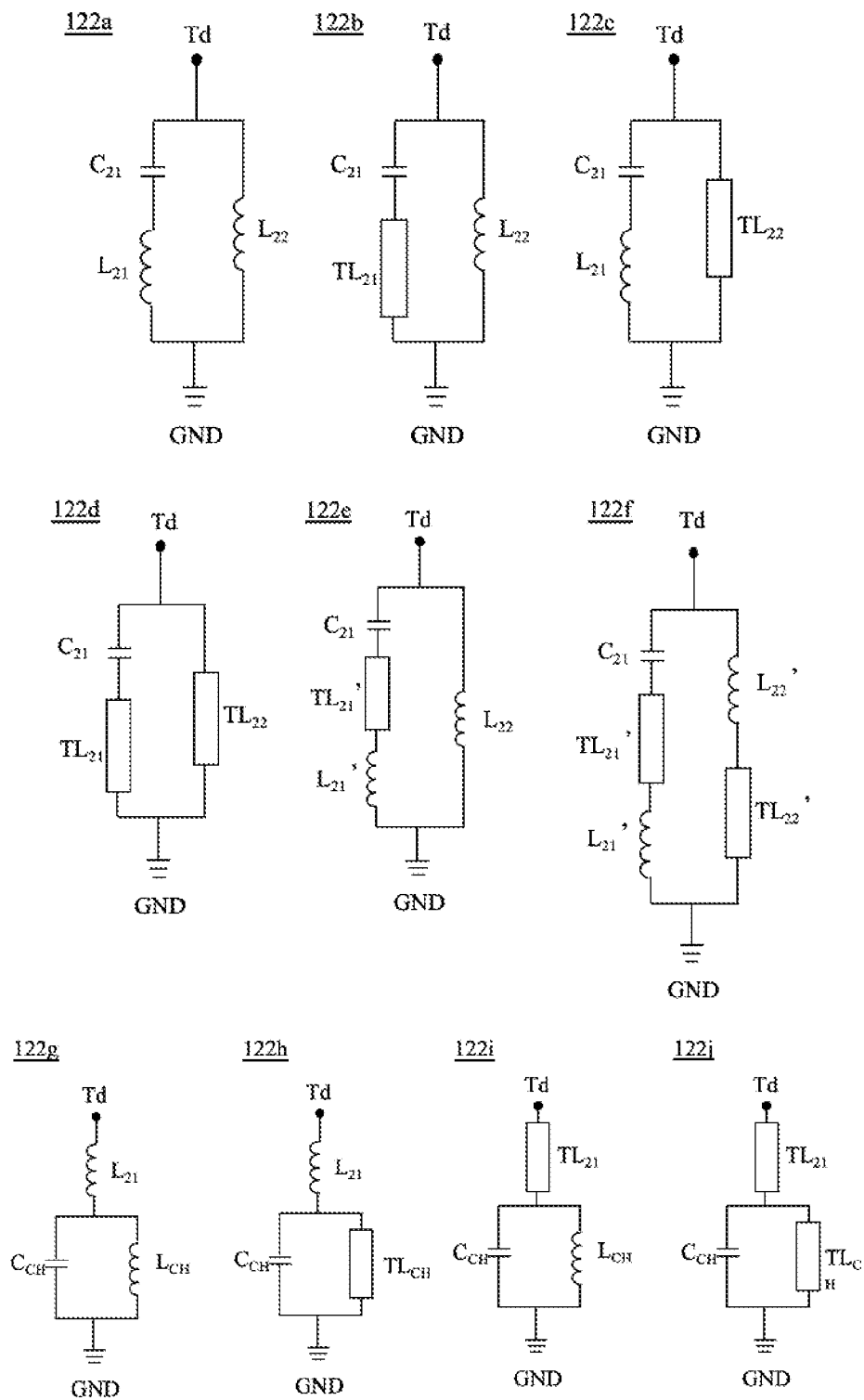

FIGS. 3A-3C are schematic circuit diagrams of a RF power amplifier having a hybrid integrated matching network according to some exemplary embodiments of FIG. 1B.

Refer to FIG. 3A, which illustrates schematic structure of the impedance inverter 121 and the harmonic termination circuit 122. The impedance inverter 121 includes a transmission circuit TC and two reactance components $X_i$ and $X_j$. The transmission circuit TC is electrically connected between the first terminal T1 and the second terminal T2. The reactance component $X_i$ is electrically connected between the first terminal T1 and the RF ground GND. The reactance component $X_j$ is electrically connected between the second terminal T2 and the RF ground GND. The reactance components $X_i$ and $X_j$ can be capacitive or inductive, based on the relationship of the device parasitic capacitance $C_{DS}$ and shunt capacitance value of the impedance inverting network used.

The harmonic termination circuit 122 includes a capacitive component and two inductive components, in which the capacitive component is electrically connected to one of the inductive components in parallel and to the other one of the inductive components in series.

In some embodiments, the transmission circuit TC includes at least one of an inductor and a transmission line, depending on the design choice of the type of impedance inverting network used.

In some embodiments, at least one of the capacitive component and the two inductive components could be configured to directly connect to the drain electrode of the transistor TR1.

In some embodiments, one of the capacitive component and the two inductive components is disposed closest to the drain electrode of the transistor TR1 in the circuit layout.

Further refer to FIG. 3B, which shows the various exemplary embodiments of the impedance inverter 121 shown in FIG. 3A.

According to the process, material, and size of the transistor TR1, which may affect the output parasitic capacitance presented by the transistor TR1, the impedance inverter 121 can be selectively implemented by the impedance inverter 121a-121d, in which each implementation constitutes, along with the output parasitic capacitance $C_{DS}$ of the transistor TR1, a corresponding impedance inverting network IIN.

In the present embodiment, the impedance inverters 121a-121d are taking one stage low pass π-type quarter wave transformer/filter as an example, in which the transmission circuit TC is implemented by the inductor $L_0$ or the transmission line $TL_0$, and the reactance component $X_j$ electrically connected to the second terminal T2 is implemented by the capacitor $C_{12}$. The reactance component $X_i$ electrically connected to the first terminal T1 can be implemented by the capacitor $C_{11}$ (see the impedance inverter 121a, 121c) or the inductor $L_{11}$ (see the impedance invert 121b, 121d), depending on whether the output parasitic capacitance $C_{DS}$ is greater than the capacitance of the capacitor $C_{12}$ of the one stage low pass π-type quarter wave transformer/filter. To be specific, the one stage low pass π-type lumped quarter wave transformer/filter consists of two shunt capacitors $C_O$ and one series connected inductor $L_0$ while the one stage low pass π-type reduced length quarter wave transformer/filter consists of two shunt capacitors $C_{OT}$ and one series connected the transmission line $TL_0$ In order to make the impedance inverting network IIN equal to a one stage low pass π-type lumped or reduced-length quarter-wavelength transmission line with a 90 degrees phase delay, the inductor $L_0$ or the transmission line $TL_0$ can be sized to meet the below equation:

$$L_O = \frac{R_{OPT}}{\omega_0};$$

$$Z_0 = \frac{R_{OPT}}{\sqrt{1-(\omega_0 * C_{OT} * R_{OPT})^2}};$$

$$\theta_O = \cos^{-1}(\omega_0 * C_{OT} * R_{OPT});$$

where $R_{OPT}$ is the fundamental impedance, wo is the fundamental frequency, $C_{OT}$ is the shunt capacitance of the one stage low pass π-type reduced-length quarter-wavelength transmission line, $Z_0$ is the characteristic impedance of the transmission line $TL_0$, and $\theta_0$ is the electrical angle of the transmission line $TL_0$.

The capacitor $C_{12}$ is sized to have the capacitance $C_O$ calculated from the fundamental impedance of the transistor TR1, in which the capacitance $C_O$ follows below the equation of $$C_O = \frac{1}{R_{OPT}\omega_0}.$$

Similarly, the capacitor $C_{12}$ is sized to have the capacitance $C_{OT}$ calculated from the fundamental impedance of the transistor TR1 using equation not shown here. Note that $C_{OT}$ and $C_O$ uses different equations.

When the output parasitic capacitance $C_{DS}$ is less than the capacitance $C_{12}$, the capacitor $C_{11}$ is selected to implement the reactance component $X_i$, so that the equivalent capacitance of the $C_{11}$ and $C_{DS}$ equal to the capacitance $C_{12}$. Therefore, in order to fulfill the above requirement, the capacitor $C_{11}$ can be sized to meet below equation:

$$C_{11}=C_{12}-C_{DS};$$

where $C_{11}$ is the capacitance of the first capacitor.

When the output parasitic capacitance $C_{DS}$ is greater than the capacitance $C_{12}$, the inductor $L_{11}$ is selected to implement the reactance component $X_i$, so that the equivalent capacitance of the $L_{11}$ and $C_{DS}$ equal to the capacitance $C_{12}$. Therefore, in order to fulfill the above requirement, the inductor $L_{11}$ can be sized to meet below equation:

$$L_{11} = \frac{1}{\omega_0^2(C_{DS} - C_{12})};$$

where $L_{11}$ is the inductance of the first inductor $L_{11}$.

Briefly speaking, a two-port impedance inverting network is used for hybrid integrated matching 220 design. It includes at least one shunt capacitor (e.g., $C_{11}$) or shunt inductor (e.g., $L_{11}$) at the end close to the transistor and series connected to the transmission circuit TC. The shunt capacitor/inductor are configured at the end to absorb the transistor parasitic capacitance and inductance. The four typical generic configurations are shown. In the case 121a, both the terminals T1 and T2 are connected to shunt capacitors $C_{11}$ and $C_{12}$, respectively. In the case 121b, only the terminal T2 is connected to shunt capacitor C12 and the terminal T1 is connected to the shunt inductance (e.g., $L_{11}$). The case 121c is similar to 121a and the case 121d is similar to 121b. The difference is that the inductor $L_0$ shown in 121a/121b is replaced by the transmission line $TL_0$ in 121c/121d and capacitance $C_O$ shown in 121a/121b is replaced by the capacitance $C_{OT}$ in 121c/121d.

In some embodiments, the impedance inverting network IIN can be implemented by a quarter wave transmission line, which has the effective circuit structure equal to the one stage low pass π-type filter as shown in FIG. 3B. The quarter wave transmission line can be sized to meet below equation:

$$Z_T = \sqrt{R_{OPT} * Z_{LOAD}};$$

where $Z_T$ is the characteristics impedance of the quarter wave transmission line and $Z_{LOAD}$ is the impedance of the load.

It should be noted that, although the embodiments shown in FIGS. 3A and 3B depict one stage low pass π-type quarter wave filter as an example, but the present invention is not limited thereto. For example, the impedance inverting network could be a low pass $n^{th}$ stage lumped quarter wave transformer, a low pass $n^{th}$ stage reduced length quarter wave transmission line, a quasi-lumped $n^{th}$ order low pass filter, a quasi-lumped $n^{th}$ order low pass quarter wave transformer, a quasi-lumped low pass Chebyshev transformer, a quasi-lumped low pass Chebyshev quarter wave transformer, quasi-lumped low pass quarter wave stepped impedance transformer and a quasi-lumped low pass quarter wave stepped impedance quarter wave transformer, etc., as long as the impedance inverting network uses a low pass network with shunt capacitance configuration at extreme ends to absorb the device parasitic and the transmission circuit TC in the middle as shown in FIG. 3B.

Further refer to FIG. 3C, which shows the various exemplary embodiments of the harmonic termination circuit 122 shown in FIG. 3A.

The harmonic termination circuit 122 can be selectively implemented by the harmonic termination circuits 122a-122j, in which the harmonic termination circuits 122a-122f can be used to implement providing a low impedance at $2^{nd}$ harmonic frequency and a high impedance at $3^{rd}$ harmonic frequency, and the harmonic termination circuits 122g-122j can be used to implement providing a high impedance at $2^{nd}$ harmonic frequency or low impedance at $2^{nd}$ harmonic or low impedance at $3^{rd}$ harmonic frequency.

With respect to the harmonic termination circuit 122a-122f, the harmonic termination circuit includes a first capacitive component (e.g., the capacitor $C_{21}$), a first inductive component (e.g., the inductor $L_{21}$ or the transmission line $TL_{21}$), and a second inductive component (e.g., the inductor $L_{22}$ or the transmission line $TL_{22}$). The first inductive component is electrically connected to the first capacitive component in series and interposed between the drain electrode Td of the transistor TR1 and the RF ground GND. The second inductive component has one end electrically connected to the drain electrode Td of the transistor TR1 and to the first terminal T1 and the other end electrically connected to RF ground GND.

The first capacitive component and the first inductive component are sized to present a low impedance path connecting to the RF ground GND at the first target harmonic of the fundamental frequency. The second inductive component is sized such that the first capacitive component, the first inductive component, and the second inductive component behave as an open circuit relative to the RF ground GND at the fundamental frequency.

To be specific, in the harmonic termination circuit 122a, the capacitive component is implemented by the capacitor $C_{21}$, the first inductive component is implemented by the inductor $L_{21}$, and the second inductive component is implemented by the inductor $L_{22}$. The harmonic terminating network includes a shunt LC network constituted by the inductor $L_{21}$ and capacitor $C_{21}$ connected in series.

The capacitor $C_{21}$ and the inductors $L_{21}$ and $L_{22}$ are sized to meet below equation:

$$L_{21}C_{21} = \frac{1}{(n\omega_0)^2};$$

$$L_{22} = \frac{(1 - \omega_0^2 L_{21} C_{21})}{\omega_0^2 C_{21}};$$

where $C_{21}$ is the capacitance of the capacitor $C_{21}$, $L_{21}$ is the inductance of the inductor $L_{21}$, $L_{22}$ is the inductance of the inductor $L_{22}$, and n is the index for $n^{th}$ harmonic number.

By applying the above setting, the impedance provided to the first terminal T1 by the series circuit of the capacitor $C_{21}$ and the inductor $L_{21}$ will be removed by the inductor $L_{22}$ at the fundamental frequency, so that the harmonic termination circuit 122a behaves as an open circuit relative to the RF ground GND. Thus, the impedance inverting network will be not affected by the harmonic termination circuit 122a at the fundamental frequency.

The series circuit of the capacitor $C_{21}$ and the inductor $L_{21}$ creates a low impedance path at the $2^{nd}$ harmonic frequency, so that the effective circuit observed from the intrinsic plane of the transistor TR1 can be regarded as a short circuit, which means the output impedance $R_O$ of the transistor TR1 is a low impedance. The above equations can be simplified, at the $2^{nd}$ harmonic frequency, as below:

$$L_{21}C_{21} = \frac{1}{4\omega_0};$$

$$L_{22} = 3L_{21}.$$

The inductor $L_{21}$ can be calculated using boundary condition equations for class F design, such that the capacitor $C_{21}$ and the inductors $L_{21}$ and $L_{22}$ further present an impedance relative to RF ground to make the effective circuit observed from the intrinsic plane of the transistor TR1 can be regarded as a open circuit at $3^{rd}$ harmonic frequency, which means the output impedance $R_O$ of the transistor TR1 is a high impedance at $3^{rd}$ harmonic frequency. Therefore, the $2^{nd}$ harmonic short and $3^{rd}$ harmonic open operation, which refers to class F operation, can be achieved.

The harmonic termination circuits 122b-122d are similar to the harmonic termination circuit 122a. The difference is that the inductor $L_{21}/L_{22}$ used in the harmonic termination circuit 122a is replaced by the transmission line $TL_{21}/TL_{22}$ which is effectively the same as the inductor $L_{21}/L_{22}$. In other words, the shunt inductor $L_{21}$ can be replaced by the shunt transmission line $TL_{21}$ with characteristics impedance $Z_{21}$ and electrical angle $\theta_{21}$, and the shunt inductor $L_{22}$ can be replaced by the shunt transmission line $TL_{22}$ with characteristics impedance $Z_{22}$ and electrical angle $\theta_{22}$. The similar part can be referred to the embodiment of the harmonic termination circuit 122a described above and will not be further repeated.

To be specific, in the harmonic termination circuit 122b, the first inductive component is implemented by the transmission line $TL_{21}$, which is sized to meet below equation:

$$Z_{21} \tan(\theta_{21}) = \omega_0 L_{21};$$

where $Z_{21}$ is the characteristic impedance of the transmission line $TL_{21}$, and $\theta_{21}$ is the electrical angle of the transmission line $TL_{21}$.

In the harmonic termination circuit 122c, the second inductive component is implemented by the transmission line $TL_{22}$, which is sized to meet below equation:

$$Z_{22} \tan(\theta_{22}) = \omega_0 L_{22};$$

where $Z_{22}$ is the characteristic impedance of the transmission line $TL_{22}$, and $\theta_{22}$ is the electrical angle of the transmission line $TL_{22}$.

In the harmonic termination circuit 122d, the first inductive component and the second inductive component are implemented by the transmission lines $TL_{21}$ and $TL_{22}$, respectively. The design criteria for the transmission lines $TL_{21}$ and $TL_{22}$ can refer to the above explanation and will not be further repeated herein.

The harmonic termination circuit 122e is similar to the harmonic termination circuit 122a. The difference is that the first inductive component in the harmonic termination circuit 122e is implemented by the combination of the inductor $L_{21}'$ and the transmission line $TL_{21}'$, in which the effective impedance of the inductor $L_{21}'$ and the transmission line $TL_{21}'$ is equal to that of the inductor $L_{21}$ which is being replaced with. Thus, the inductor $L_{21}'$ and the transmission line $TL_{21}'$ are required to be sized to meet below equation:

$$Z_{21}' \tan(\theta_{21}') + \omega_0 L_{21}' = \omega_0 L_{21};$$

where $Z_{21}'$ is the characteristic impedance of the transmission line $TL_{21}'$, $\theta_{21}'$ is the electrical angle of the transmission line $TL_{21}'$, and $L_{21}'$ is the inductance of the inductor $L_{21}'$.

The harmonic termination circuit 122f is similar to the harmonic termination circuit 122e. The difference is that the second inductive component in the harmonic termination circuit 122f is implemented by the combination of the inductor $L_{22}'$ and the transmission line $TL_{22}'$, in which the effective impedance of the inductor $L_{22}'$ and the transmission line $TL_{22}'$ is equal to that of the inductor $L_{22}$ which is being replaced with. Thus, the inductor $L_{22}'$ and the transmission line $TL_{22}'$ are required to be sized to meet below equation:

$$Z_{22}' \tan(\theta_{22}') + \omega_0 L_{22}' = \omega_0 L_{22};$$

where $Z_{22}'$ is the characteristic impedance of the transmission line $TL_{22}'$, $\theta_{22}'$ is the electrical angle of the transmission line $TL_{22}'$, and $L_{22}'$ is the inductance of the inductor $L_{22}'$.

With respect to the harmonic termination circuits 122g-122j, the harmonic termination circuit includes a first inductive component (e.g., the inductor $L_{21}$ or the transmission line $TL_{21}$) and an LC tank (e.g., the capacitor $C_{CH}$ along with the inductor $L_{CH}$/the transmission line $TL_{CH}$). The LC tank is electrically connected to the first inductive component in series and between the drain electrode Td of the transistor TR1 and the RF ground GND. The LC tank comprises a second inductive component (e.g., the inductor $L_{CH}$/the transmission line $TL_{CH}$) and a first capacitive component (e.g., the capacitor $C_{CH}$) electrically connected in parallel.

The first inductive component and the second inductive component are configured to present the second harmonic high impedance, the second harmonic low impedance, or the third harmonic low impedance at a time, at the intrinsic plane of the transistor TR1.

In other words, the inductance of the first inductive component is configured to present the required second harmonic high impedance termination at the intrinsic plane of that transistor with which the harmonic terminating network is connected.

To be specific, in the harmonic termination circuit 122g, the first inductive component is implemented by the inductor $L_{21}$, the second inductive component is implemented by the inductor $L_{CH}$, and the first capacitive component is implemented by the capacitor $C_{CH}$.

In the present embodiment, the inductor $L_{CH}$ and the capacitor $C_{CH}$ constitute an LC tank and are resonated out at fundamental frequency so that the entire harmonic terminating network present high impedance relative to the RF ground at fundamental frequency and does not affect the impedance inverting network functioning. The inductor $L_{CH}$ and the capacitor $C_{CH}$ are sized to meet the following equation to present a high impedance relative to the RF ground GND at the fundamental frequency:

$$L_{CH} C_{CH} = \frac{1}{(\omega_0)^2};$$

where $L_{CH}$ is the inductance of the inductor $L_{CH}$ and $C_{CH}$ is the capacitance of the capacitor $C_{CH}$.

The harmonic termination circuits 122h-122j are similar to the harmonic termination circuit 122g. The difference is that the inductor $L_{21}/L_{CH}$ used in the harmonic termination circuit 122g is replaced by the transmission line $TL_{21}/TL_{CH}$ which is effectively the same as the inductor $L_{21}/L_{22}$.

In some embodiments, the capacitive component included in the impedance inverter 121 and the harmonic termination circuit 122 can be implemented by a static capacitor or a tunable capacitor, but the present invention is not limited thereto.

Figure 4A:
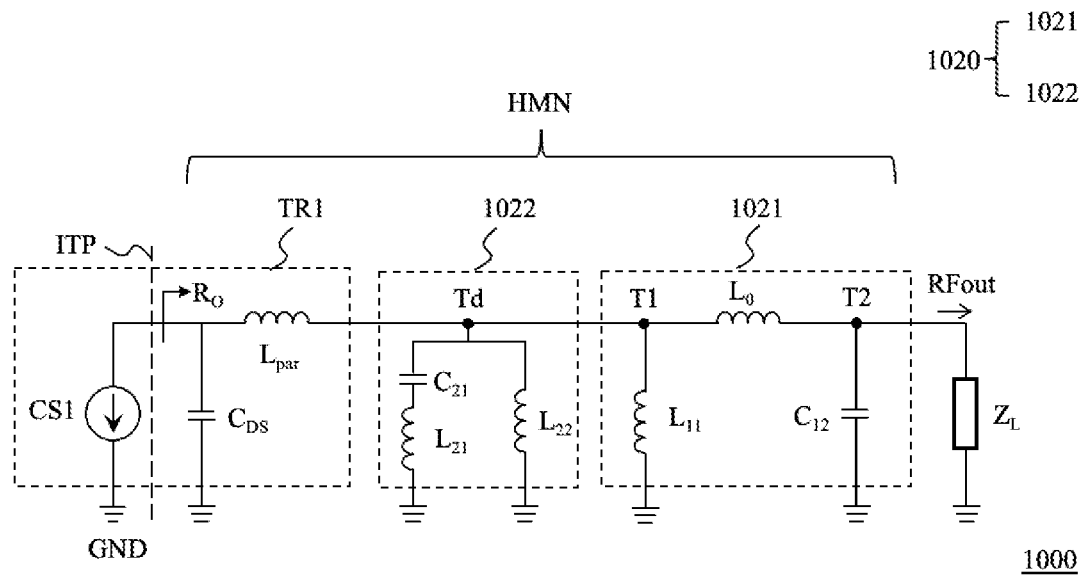
FIG. 4A is a schematic circuit diagram of a RF power amplifier with a shunt inductance according to some exemplary embodiments of FIGS. 3A-3C.
Figure 4B:
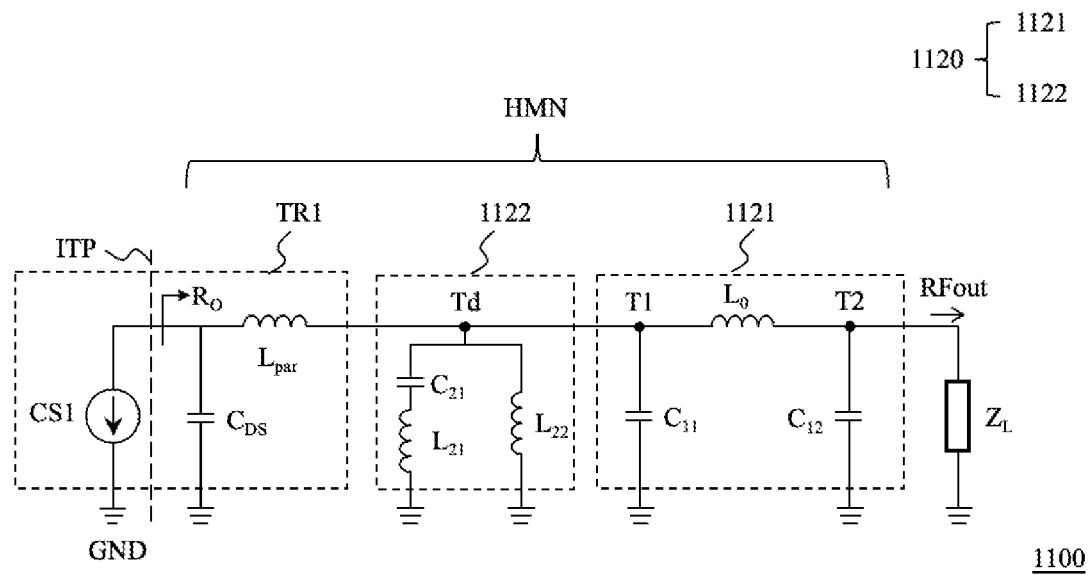
FIG. 4B is a schematic circuit diagram of a RF power amplifier with a shunt capacitance according to some exemplary embodiments of FIGS. 3A-3C.

Two different exemplary schematic RF power amplifier are shown in FIG. 4A and FIG. 4B, in which FIG. 4A is a schematic circuit diagram of a RF power amplifier with a shunt inductance according to some exemplary embodiments of FIGS. 3A-3C, and FIG. 4B is a schematic circuit diagram of a RF power amplifier with a shunt capacitance according to some exemplary embodiments of FIGS. 3A-3C.

Refer to FIG. 4A, the RF power amplifier 1000 includes the transistor TR1 and the hybrid integrated matching circuit 1020. The hybrid integrated matching circuit 1020 is constituted by the impedance inverter 1021 and the harmonic termination circuit 1022. Because of the parasitic capacitance $C_{DS}$ is greater than the capacitance $C_O$, the impedance inverter 1021 can be selected to implement by the topology 121b as shown in FIG. 3B. The harmonic termination circuit 1022 is implemented by the topology 122a as shown in FIG. 3C.

In the present embodiment, the harmonic matching network HMN is formed by the parasitic capacitance $C_{DS}$, the parasitic inductance $L_{par}$, the capacitors $C_{12}$ and $C_{21}$, and the inductors $L_0$, $L_{11}$, $L_{21}$, and $L_{22}$. In other words, the above-mentioned components contribute as a part of the harmonic matching network HMN.

In some embodiments, the shunt inductors $L_{11}$ and $L_{22}$ can be integrated together because they are in parallel and replaced by a single inductor with the inductance equal to the combination of the inductors $L_{11}$ and $L_{22}$. Therefore, even though the topology shown in FIG. 4A is implemented by a RF power amplifier product, two inductors do not necessary to be visibly found at the circuit board of the RF power amplifier product. In other words, the equivalent circuit analysis is required, in some circumstances, to determine whether the RF power amplifier uses the disclosed invention.

In other words, the drain electrode of the transistor TR1 can be biased by the resultant inductive component from the impedance inverter and the harmonic termination circuit, and wherein the inductive component is realized partly or fully by using at least one of a transmission line and an inductor.

Refer to FIG. 4B, the RF power amplifier 1100 includes the transistor TR1 and the hybrid integrated matching circuit 1120. The hybrid integrated matching circuit 1120 is constituted by the impedance inverter 1121 and the harmonic termination circuit 1122. Because of the parasitic capacitance $C_{DS}$ is less than the capacitance $C_O$, the impedance inverter 1121 can be selected to implement by the topology 121a as shown in FIG. 3B. The harmonic termination circuit 1122 is implemented by the topology 122a as shown in FIG. 3C.

In the present embodiment, the harmonic matching network HMN is formed by the parasitic capacitance $C_{DS}$, the parasitic inductance $L_{par}$, the capacitors $C_{11}$, $C_{12}$ and $C_{21}$, and the inductors $L_0$, $L_{21}$, and $L_{22}$. In other words, the above-mentioned components contribute as a part of the harmonic matching network HMN.

Figure 5A:
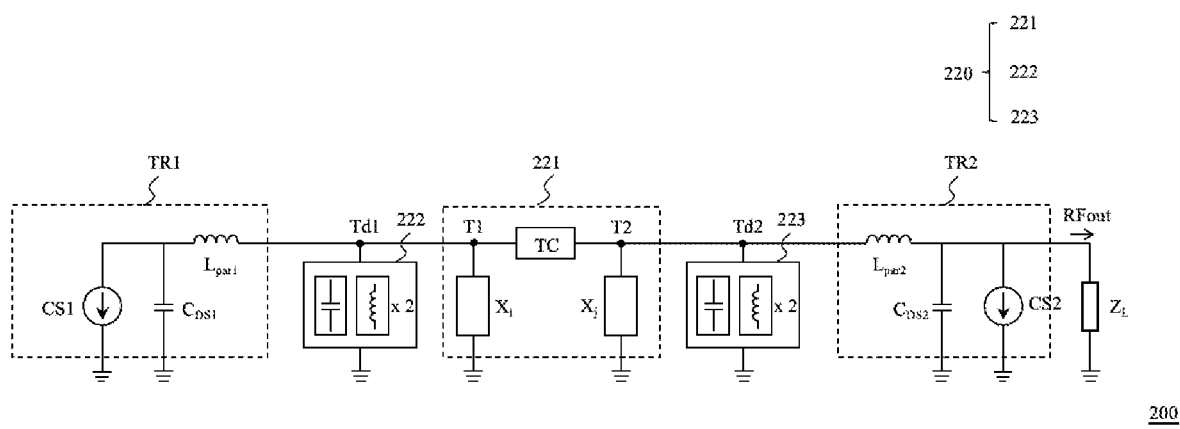
FIGS. 5A and 5B are schematic circuit diagrams of a RF power amplifier having a fully hybrid integrated matching network according to some exemplary embodiments of FIG. 2B.
Figure 5B:
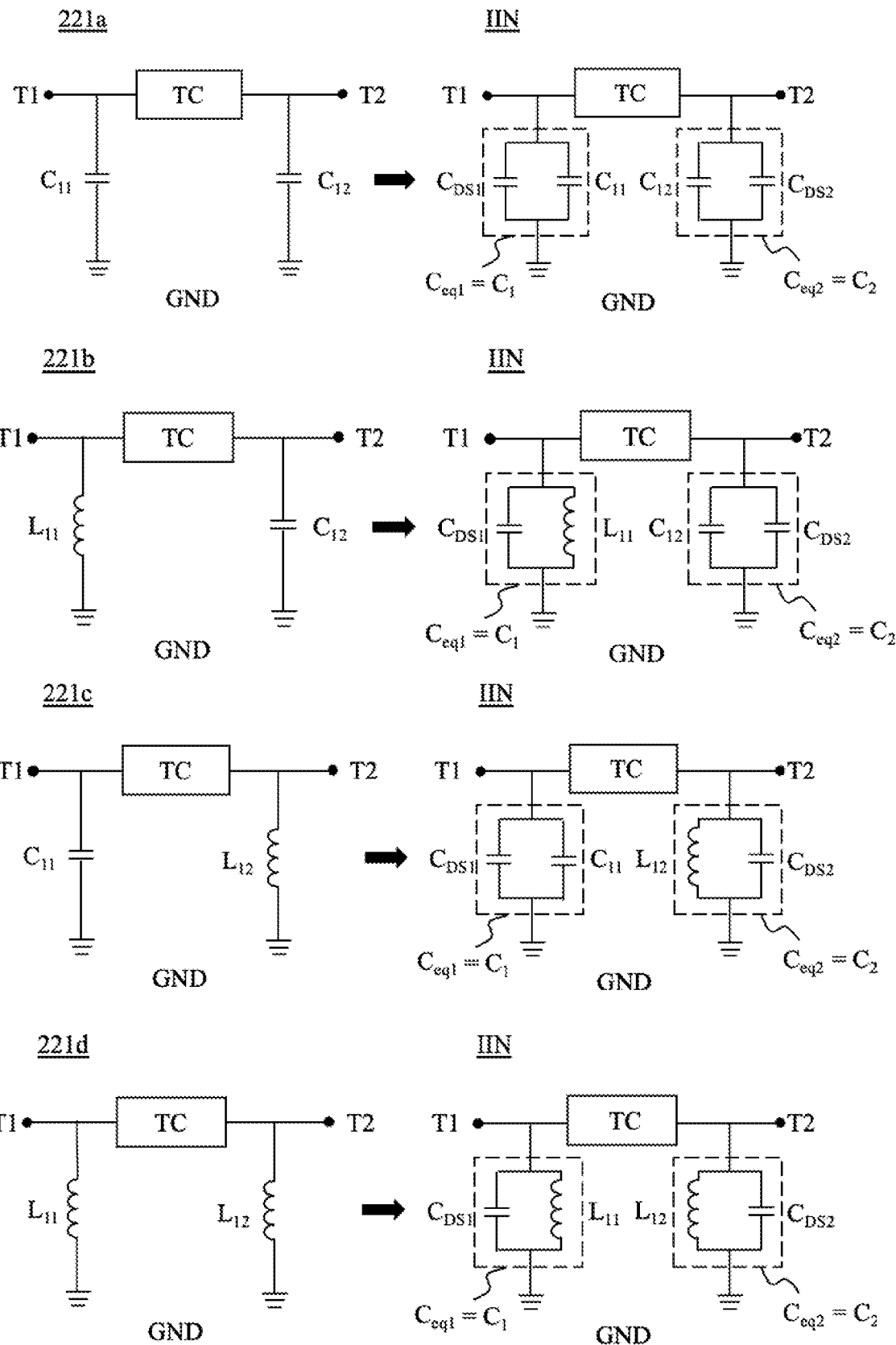

FIGS. 5A and 5B are schematic circuit diagrams of a RF power amplifier having a fully hybrid integrated matching network according to some exemplary embodiments of FIG. 2B;

Refer to FIG. 5A, which illustrates schematic structure of the impedance inverter 221 and the harmonic termination circuits 222 and 223 in the fully hybrid integrated matching circuit 220 The impedance inverter 221 includes a transmission circuit TC and two reactance components $X_i$ and $X_j$. The transmission circuit TC has one end electrically connected to the drain electrode Td1 of the main transistor TR1 through the first terminal T1 and the other end electrically connected to the drain electrode Td2 of the peaking transistor TR2 through the second terminal T2. In other word, the transmission circuit TC is electrically connected between the first terminal T1 and the second terminal T2 and also between the main transistor TR1 and the peaking transistor TR2. The reactance component $X_i$ is electrically connected between the first terminal T1 and the RF ground GND. The reactance component $X_j$ is electrically connected between the second terminal T2 and the RF ground GND.

The harmonic termination circuits 222 and 223 respectively includes a capacitive component and two inductive components, in which the capacitive component is electrically connected to one of the inductive components in parallel and to the other one of the inductive components in series.

In some embodiments, at least one of the capacitive component and the two inductive components in the harmonic termination circuit 222 could be configured to directly connect to the drain electrode of the transistor TR1. Similarly, at least one of the capacitive component and the two inductive components in the harmonic termination circuit 223 could be configured to directly connect to the drain electrode of the transistor TR2.

In some embodiments, one of the capacitive component and the two inductive components in the harmonic termination circuit 222 is disposed closest to the drain electrode Td1 of the transistor TR1 in the circuit layout. Similarly, one of the capacitive component and the two inductive components in the harmonic termination circuit 223 is disposed closest to the drain electrode Td2 of the transistor TR2 in the circuit layout.

Further refer to FIG. 5B, which shows the various exemplary embodiments of the impedance inverter 221 shown in FIG. 5A.

According to the process, material, and size of the transistors TR1 and TR2 which may affect the output parasitic capacitance presented by the transistors TR1 and TR2, the impedance inverter 221 can be selectively implemented by the impedance inverter 221a-221d, in which each implementation constitutes, along with the output parasitic capacitances $C_{DS1}$ and $C_{DS2}$ of the transistors TR1 and TR2, a corresponding impedance inverting network IIN.

In the present embodiment, the impedance inverters 221a-221d are taking generic low pass $n^{th}$ stage quarter wave filter as an example, in which the transmission circuit TC can refer to the those described in the embodiments of FIG. 3B when the impedance inverters 221a-221d is a one stage low pass π-type quarter wave filter.

The reactance component $X_i$ electrically connected to the first terminal T1 can be implemented by the capacitor $C_{11}$ (see the impedance inverter 221a, 221c) or the inductor $L_{11}$ (see the impedance inverter 221b, 221d), depending on whether the output parasitic capacitance $C_{DS1}$ is greater than the capacitance $C_1$ which could be $C_O$ or $C_{OT}$. Similarly, the reactance component $X_j$ electrically connected to the second terminal T2 can be implemented by the capacitor $C_{12}$ (see the impedance inverter 221b, 221a) or the inductor $L_{12}$ (see the impedance inverter 221d, 221c), depending on whether the output parasitic capacitance $C_{DS2}$ is greater than the capacitance of the capacitor $C_2$ which could be $C_O$ or $C_{OT}$.

The design criteria of the present embodiment is similar to that of the embodiments shown in FIG. 3B. The capacitors $C_{11}$ and $C_{12}$ are sized to meet below equation:

$$C_{11} = C_1 - C_{DS1};$$

$$C_{12} = C_2 - C_{DS2};$$

where the previous definition for each term can also be applied in the present embodiment and $C_1$ can be equal to $C_2$.

In addition, the inductors $L_{11}$ and $L_{12}$ are sized to meet below equation:

$$L_{11} = \frac{1}{\omega_o^2 (C_{DS1} - C_1)};$$

$$L_{12} = \frac{1}{\omega_o^2 (C_{DS2} - C_2)}.$$

Briefly speaking, the impedance inverter 221 includes at least one shunt capacitor (e.g., $C_{11}/C_{12}$) or shunt inductor (e.g., $L_{11}/L_{12}$) at the end close to the connected transistor TR1/TR2 and series connected to the transmission circuit TC. The shunt capacitor/inductor configuration at the end to absorb the transistor parasitic capacitance and inductance. The four typical generic configurations are shown. In the case 221a, both the terminals T1 and T2 are connected to shunt capacitors $C_{11}$ and $C_{12}$, respectively. In the case 221b, only the terminal T2 is connected to shunt capacitor $C_{12}$ and the terminal T1 is connected to the shunt inductor $L_{11}$. In the case 221c, only the terminal T1 is connected to shunt capacitor $C_{11}$ and the terminal T2 is connected to the shunt inductor $L_{12}$. In the case 221*d*, both the terminals T1 and T2 are connected to shunt inductors $L_{11}$ and $L_{12}$, respectively. It should be noted that, the inductors (e.g., $L_{11}/L_{12}$) are used to explain the topology of the impedance inverter 221, but the invention is not limited thereto. The inductors can be replaced by the transmission line as mentioned in the embodiments of FIG. 3B.

In some embodiments, the impedance inverting network IIN can be implemented a quarter wave transmission line. At the fundamental frequency, the value of the common load $Z_L$ is selected to be equal to half of a fundamental impedance at the intrinsic plane of the main transistor TR1 and the quarter wave transmission line is sized to have the characteristics impedance equal to the fundamental impedance at the intrinsic plane of the main transistor TR1.

The design criteria for the harmonic termination circuits 222 and 223 are similar to that shown in FIG. 3C, thus will not be further repeated herein.

For the Doherty power amplifier (e.g., 200, 1000, 1100), the fundamental matching network is not used at all for both main and peaking transistors TR1 and TR2, causing circuit miniaturization and also solving the bandwidth limitations which comes from using a complex fundamental matching network for main and peaking transistors TR1 and TR2.

The Fully hybrid Integrated matching network uses both main and peaking transistor output parasitic capacitance (drain to source capacitance $C_{DS}$, Miller capacitance between the drain and source of the devices) and output parasitic inductance, for impedance inverting load modulating network design and also providing harmonic load terminations such as second and third harmonic, (class F, F$^{-1}$, J or continuum class F, F$^{-1}$, J) for main and or peaking device operating as switch mode power amplifier.

All the cases mentioned above provide the unique fully hybrid integrated matching circuit 220 which provide not only load modulation but also very high efficiency using the switch mode power amplifier over a wide bandwidth. The Fully hybrid Integrated matching network is also compact in size without using any fundamental matching network or offset lines and provides circuit miniaturization which is crucial for Radio Frequency Integrated Circuits (RFIC) applications.

FIGS. 6A-6E are schematic circuit diagrams of a RF power amplifier having a fully hybrid integrated matching network according to some exemplary embodiments of the present disclosure.

Figure 6A:
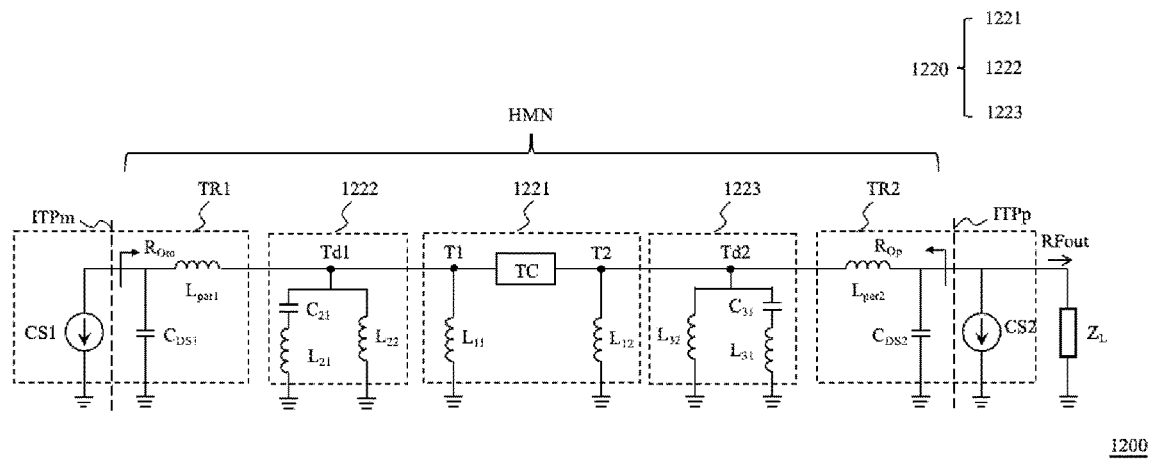
FIGS. 6A-6E are schematic circuit diagrams of a RF power amplifier having a fully hybrid integrated matching network according to some exemplary embodiments of the present disclosure.

Refer to FIG. 6A, the Doherty power amplifier 1200 includes the main transistor TR1, the peaking transistor TR2, and the hybrid integrated matching circuit 1220, in which the hybrid integrated matching circuit 1220 includes the impedance inverter 1221 and the harmonic termination circuits 1222 and 1223.

The hybrid integrated matching circuit 1220 is used for designing the load modulated Doherty power amplifier output stage. The first equivalent shunt capacitance $C_1$ of the low pass π-type lumped or reduced length quarter wave transmission line, is implemented using the combination of the main transistor TR1 output parasitic components $L_{par}$ and Cost and the shunt inductance $L_{11}$ on the main transistor TR1 side. The second equivalent shunt capacitance $C_2$ of the low pass π-type lumped or reduced length quarter wave transmission line is implemented using the combination of the peaking transistor TR2 output parasitic components $L_{par2}$ and $C_{DS2}$ and the shunt inductance $L_{12}$ on the peaking transistor TR2 side. So, the first and second equivalent capacitances are respectively formed at the main and peaking side by resonating out the device output parasitic with the shunt inductances $L_{11}$ and $L_{12}$ to get the equivalent shunt capacitance $C_1$ (e.g., $C_O$ or $C_{OT}$) and $C_2$ (e.g., $C_O$ or $C_{OT}$) at main and peaking transistor side.

The harmonic termination circuit 1222 for the main transistor TR1 includes the capacitance $C_{21}$ and inductances $L_{21}$ and $L_{22}$, where the capacitance $C_{21}$ and the inductance $L_{21}$ are connected in series, and the shunt inductance $L_{22}$ is electrically connected to the capacitance $C_{21}$ and inductance $L_{21}$ in parallel. The harmonic termination circuit 1223 for the peaking transistor TR2 includes the capacitance $C_{31}$ and inductances $L_{31}$ and $L_{32}$, where the capacitance $C_{31}$ and inductances $L_{31}$ are connected in series, and the the shunt inductance $L_{32}$ is electrically connected to the capacitance $C_{31}$ and inductance $L_{31}$ in parallel.

The harmonic matching network HMN for the main transistor TR1 is formed by using the main transistor parasitic components $C_{DS1}$ and $L_{par1}$, harmonic terminating circuit 1222, the shunt inductance $L_{11}$, series transmission circuit TC, a shunt equivalent capacitance (e.g., $C_O$ or $C_{OT}$) and the modulated load impedance $Z_{Lm}$ of the main transistor TR1. Similarly, the harmonic matching network HMN for the peaking transistor TR2 is formed using, the peaking transistor parasitic components $C_{DS2}$ and $L_{par2}$, harmonic termination circuit 1223, the shunt inductance $L_{12}$, the series transmission circuit TC, the shunt equivalent capacitance and the modulated load impedance $Z_{Lp}$ of the peaking transistor TR2.

The values of the inductance $L_{21}$ and capacitance $C_{21}$ of the harmonic terminating circuit 1222 for class F harmonic load terminations can be calculated at peak power operation of the Doherty power amplifier 1200, using the following equations:

$$\left(405\omega_0^2 C_{DS1} - \frac{45\omega_0}{R_{OPT1}}\right)L_{21}^2 + L_{21}\left(135\omega_0^2 L_{11} C_{DS1} - 96 - \frac{15\omega_0 L_{11}}{R_{OPT1}}\right) = 27L_{11};$$

$$L_{21}C_{21} = \frac{1}{4\omega_0^2};$$

$$L_{11} = \frac{1}{\omega_0^2(C_{DS1} - C_O)};$$

$$L_{22} = 3L_{21};$$

where wo is the fundamental frequency, $R_{OPT1}$ is the fundamental impedance of the main transistor TR1, and $C_{DS1}$ is the parasitic output capacitance of the main transistor TR1.

The values of the inductance $L_{31}$ and capacitance $C_{31}$ of the harmonic terminating circuit 1223 can be roughly referred to the above calculation as well, and thus not further repeated herein.

In some embodiments, equations for calculation of the inductance $L_{21}/L_{31}$ and the capacitance $C_{21}/C_{31}$ values can also be calculated for a variable/modulated main or peaking amplifier load impedance $\alpha R_{OPT}$ however the value is almost constant since the modulated load is weakly coupled to harmonic matching circuit, where:

½≤α≤1; for main amplifier;

1≤α≤∞; for peaking amplifier.

Figure 6B:
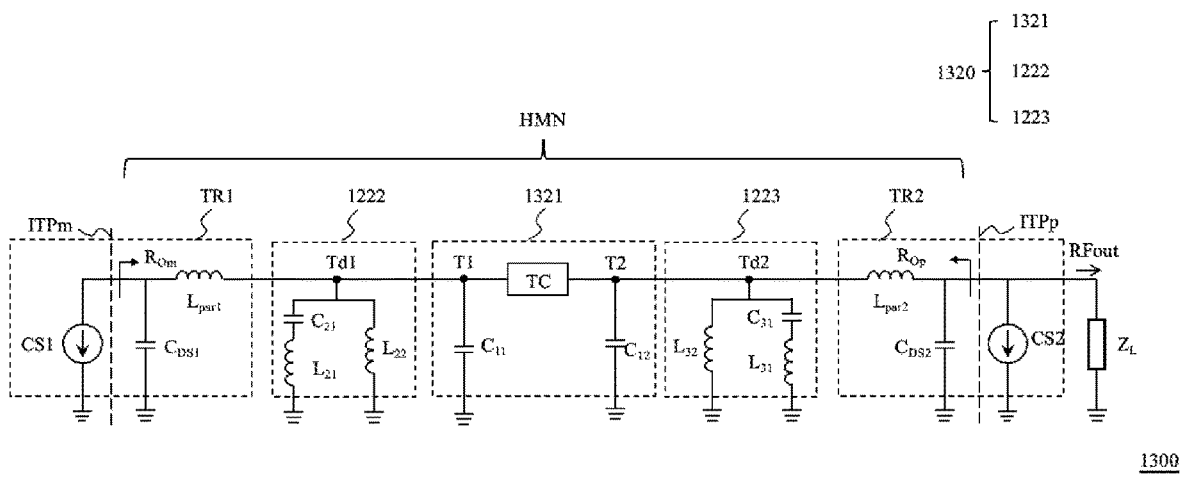

Refer to FIG. 6B, the Doherty power amplifier 1300 includes the main transistor TR1, the peaking transistor TR2, and the hybrid integrated matching circuit 1320, in which the hybrid integrated matching circuit 1320 includes the impedance inverter 1321 and the harmonic termination circuits 1222 and 1223.

The present embodiment is similar to those described in FIG. 6A. The difference is that both the inductances $L_{11}$ and $L_{12}$ shown in FIG. 6A are replaced by the capacitances $C_{11}$ and $C_{12}$ in the present embodiment.

The harmonic matching network HMN for the main transistor TR1 is formed by using the main transistor parasitic components $C_{DS1}$ and $L_{par1}$, harmonic terminating circuit 1222, the shunt capacitance $C_{11}$, series transmission circuit TC, a shunt equivalent capacitance (e.g., $C_O$ or $C_{OT}$) and the modulated load impedance $Z_{Lm}$ of the main transistor TR1. Similarly, the harmonic matching network HMN for the peaking transistor TR2 is formed using, the peaking transistor parasitic components $C_{DS2}$ and $L_{par2}$, harmonic termination circuit 1223, the shunt capacitance $C_{12}$, the series transmission circuit TC, the shunt equivalent capacitance and the modulated load impedance $Z_{Lp}$ of the peaking transistor TR2.

The values of the inductance $L_{21}$ and capacitance $C_{21}$ of the harmonic terminating circuit 1222 for class F harmonic load terminations can be calculated at peak power operation of the Doherty power amplifier 1300, using the following equations:

$$L_{21}C_{21} = \frac{1}{4\omega_0^2};$$

$$L_{21} = \frac{73 R_{OPT1}}{270 \omega_O};$$

$$L_{22} = 3 L_{21};$$

$$C_{11} = C_1 - C_{DS1};$$

$$C_{12} = C_2 - C_{DS2};$$

where the previous definition for each term can also be applied in the present embodiment and $C_1$ can be equal to $C_2$.

The values of the inductance $L_{31}$ and capacitance $C_{31}$ of the harmonic terminating circuit 1223 can be roughly referred to the above calculation as well, and thus not further repeated herein.

In some embodiments, equations for calculation of the inductance $L_{21}/L_{31}$ and the capacitance $C_{21}/C_{31}$ values can also be calculated for a variable/modulated main or peaking amplifier load impedance $\alpha R_{OPT}$ however the value is almost constant since the modulated load is weakly coupled to harmonic matching circuit, where:

½≤α≤1; for main amplifier;
1≤α≤∞; for peaking amplifier.

The similar part of the present embodiment can refer to those described in FIG. 6A, and thus will be not further repeated herein.

Figure 6C:
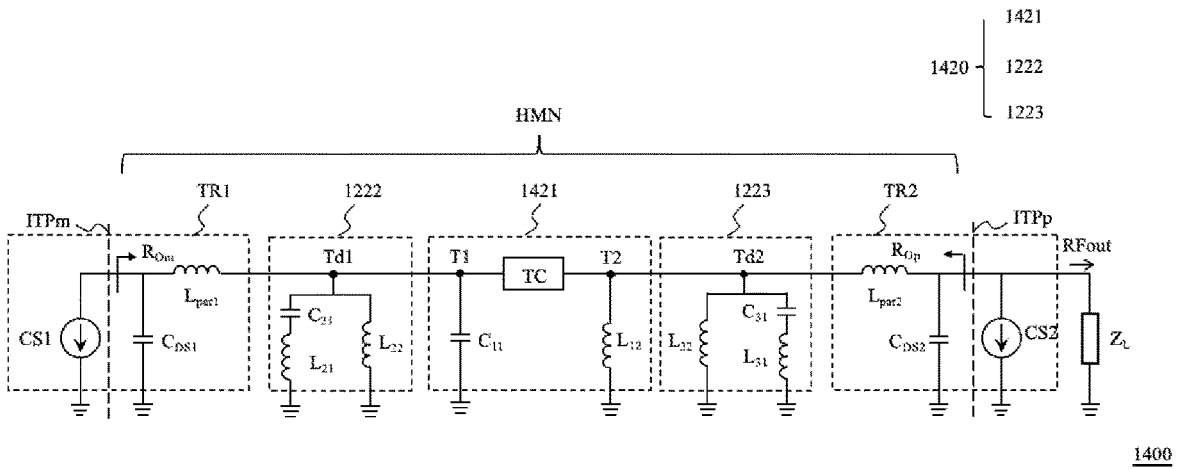

Refer to FIG. 6C, the Doherty power amplifier 1400 includes the main transistor TR1, the peaking transistor TR2, and the hybrid integrated matching circuit 1420, in which the hybrid integrated matching circuit 1420 includes the impedance inverter 1421 and the harmonic termination circuits 1222 and 1223.

The present embodiment is similar to those described in FIG. 6A. The difference is that the inductances $L_{11}$ shown in FIG. 6A is replaced by the capacitance $C_{11}$ in the present embodiment. The similar part of the present embodiment can refer to those described in FIG. 6A, and thus will be not further repeated herein.

Figure 6D:
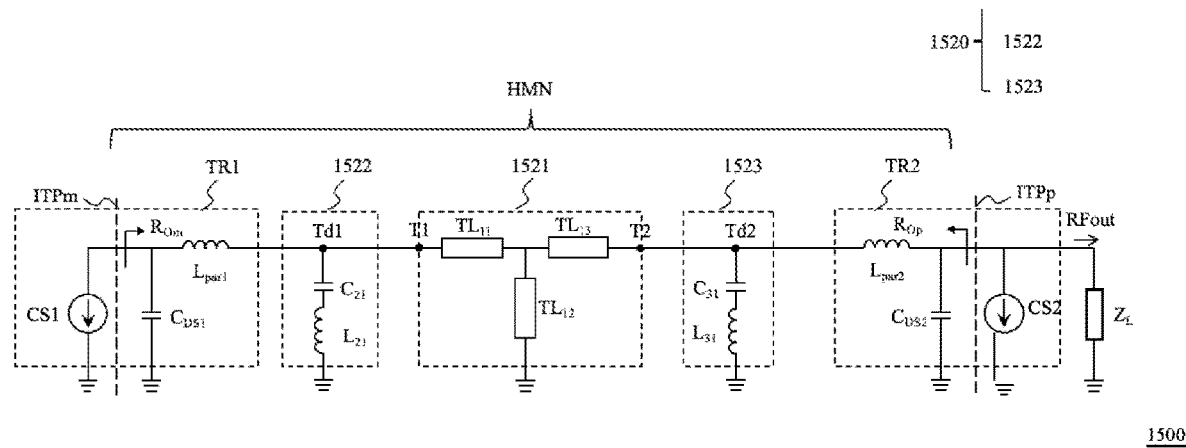

Refer to FIG. 6D, the Doherty power amplifier 1500 includes the main transistor TR1, the peaking transistor TR2, and the hybrid integrated matching circuit 1520, in which the hybrid integrated matching circuit 1520 includes the impedance inverter 1521 and the harmonic termination circuits 1522 and 1523.

The impedance inverter 1521 includes three transmission lines $TL_{11}$, $TL_{12}$, and $TL_{13}$. The transmission line $TL_{11}$ has one end electrically connected to the first terminal T1. The transmission line $TL_{12}$ is electrically connected between the other end of the transmission line $TL_{11}$ and the RF ground GND. The transmission line $TL_{13}$ has one end electrically connected to the transmission lines $TL_{11}$ and $TL_{12}$ and the other end electrically connected to the second terminal T2.

To be specific, the circuit structure of the impedance inverter 1521 is a T-type structure which can be derived from the π-type filter shown in FIGS. 6A-6C by certain transformations, for example by delta-star transformation, for further circuit miniaturization and specific application purposes. In the present embodiment, the transmission line $TL_{12}$ can be used to bias both the drain terminals of the main transistor TR1 and the peaking transistor TR2. It should be note that these three transmission lines $TL_{11}$, $TL_{12}$, and $TL_{13}$ are formed after merging the components from the harmonic terminating circuits and the impedance inverter used in FIGS. 6A-6C. Thus, the transmission lines $TL_{11}$, $TL_{12}$, and $TL_{13}$ are part of the harmonic matching network HMN. The harmonic matching network HMN for the main transistor TR1 includes main transistor output parasitic $C_{DS1}$ and $L_{par1}$, the capacitance $C_{21}$, the inductance $L_{21}$, the impedance inverter 1521, and the modulated load impedance $Z_{Lm}$. Similarly, the harmonic matching network for the peak transistor TR2 includes peak transistor output parasitic $C_{DS2}$ and $L_{par2}$, the capacitance $C_{31}$, the inductance $L_{31}$, the impedance inverter 1521, and the modulated load impedance $Z_{Lp}$ Refer to FIG. 6E, which shows the fully hybrid integrated matching circuit 1620 using internal matching techniques. In the present embodiments, the main transistor TR1 and the peaking transistor TR2 of the Doherty power amplifier 1600 are internally matched using the hybrid integrated matching circuit 1620, where the harmonic termination circuit 1222 and the shunt reactance component X1 are integrated with the main transistor TR1 to form the internally matched main device CP1, and the harmonic termination circuit 1223 and the shunt reactance component X2 are integrated with the peaking transistor TR2 to form the internally matched peaking device CP2. The drain terminals of the main transistor TR1 and the peaking transistor TR2 are connected to each other, externally through the transmission circuit TC, which can implement at least by simple bond wire, lumped MMIC inductor or microstrip line. The common load $Z_L$ is connected externally to the drain terminal of the peaking transistor TR2.

In other words, the hybrid Integrated matching circuit 1620 can be merged within the device using internal matching technique for circuit miniaturization leaving behind only other passives, exposed externally connecting the main and peaking transistors external drain terminals. The common load $Z_L$ is also connected to the extrinsic drain terminal of the peaking device.

To be specific, the Doherty power amplifier 1600 can be implemented by two separate integrated-circuit devices connecting to each other externally through the transmission circuit TC of the impedance inverter 1621. The rest part of the hybrid integrated matching circuit 1620 are merged into the main transistor TR1 and the peaking transistor TR2, respectively. Since there is no visible matching circuit except for the transmission circuit TC in the Doherty power amplifier 1600, the main transistor TR1 and the peaking transistor TR2 can be regarded as being "internally matched", which can cause a significant reduction and miniaturization of the overall Doherty power amplifier 1600.

In some embodiments, the internally matched main device CP1 and the internally matched peaking device CP2 shown here can also be flip chipped or without flip chipped into the PCB substrate via solder bump/wire-bond and the common load $Z_L$ on the PCB substrate is connected to the peaking device via solder bump or wire bond. This can significantly cause further miniaturization and integration of the Doherty power amplifier 1600 for hybrid integrated circuits (IC) Designs.

The internally matched main device CP1 includes main transistor parasitic $C_{DS1}$ and $L_{par1}$ and internally matched main device passive components including the harmonic terminating circuit 1222 and the shunt reactance X1. Similarly, the internally matched peaking device CP2 includes peaking transistor parasitic $C_{DS2}$ and $L_{par2}$ and internally matched peak device passive components including the harmonic terminating circuit 1223 and the shunt reactance X2. The biasing for the main and peaking transistors TR1 and TR2 can be provided externally using RF choke coil.

From another perspective of view, it can be regarded as the main transistor TR1 along with the first capacitive component (e.g., $C_{21}$), the first inductive component (e.g., $L_{21}$), the second inductive component (e.g., $L_{22}$), and the first reactance component (e.g., $X_1$) are packaged in a first chip CP1. The peaking transistor TR2 along with the second capacitive component (e.g., $C_{31}$), the third inductive component (e.g., $L_{31}$), the fourth inductive component (e.g., $L_{32}$), and the second reactance component (e.g., $X_2$) are packaged in a second chip CP2, wherein the first chip CP1 and the second chip CP2 are externally connected to each other through the transmission circuit TC. In addition, the components packaged in the first chip CP1 are internally matched with the main transistor TR1, and the components packaged in the second chip CP2 are internally matched with the second transistor TR2.

In some embodiments, the first chip CP1 and the second chip CP2 are disposed on a substrate which can be implemented by one of a printed circuit board (PCB), a laminate, an interpose, an integrated passive device (IPD) substrate, and combinations thereof.

Figure 7A:
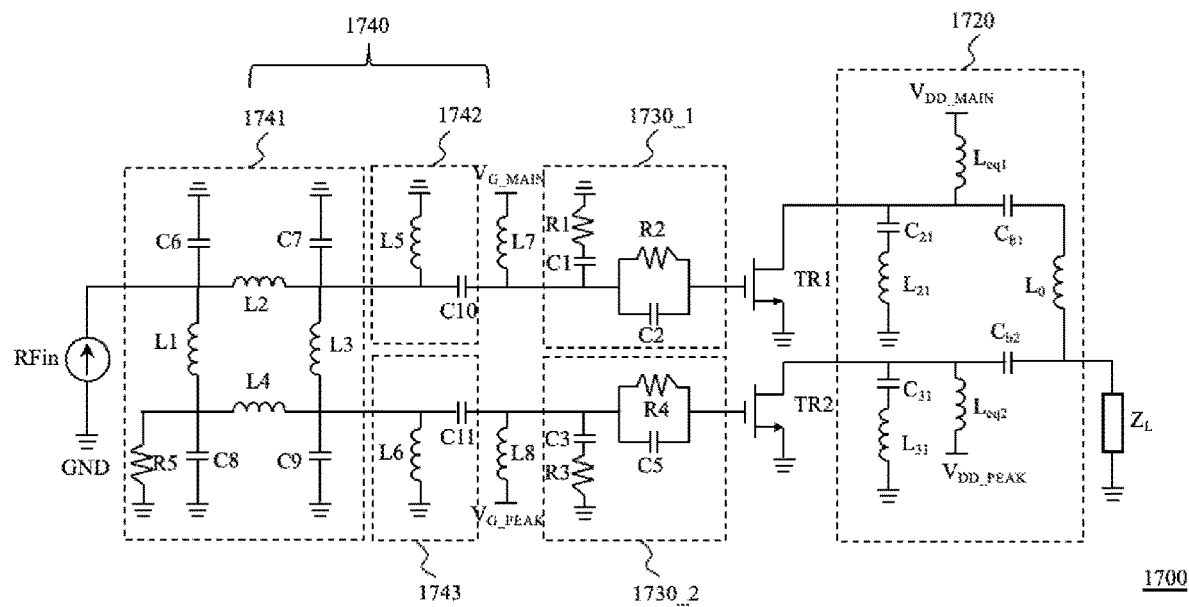
FIGS. 7A-7D are schematic circuit diagrams of a Doherty power amplifier having a fully hybrid integrated matching network according to some exemplary embodiments of the present disclosure.

FIGS. 7A-7D are schematic circuit diagrams of a Doherty power amplifier having a fully hybrid integrated matching network according to some exemplary embodiments of the present disclosure;

Refer to FIG. 7A, which shows the overall detailed circuit diagram for realization of the Doherty power amplifier using the fully hybrid integrated matching circuit 1720 according to the present disclosure.

The Doherty power amplifier 1700, using hybrid integrated matching circuit 1720 as shown in FIG. 6A, using class F harmonic termination for main and peaking transistor TR1 and TR2 and one stage low pass π-type lumped quarter wave transmission line as impedance inverting network as shown in FIG. 5B. The gate biasing for the main transistor TR1 and gate biasing for the peaking transistor TR2 are simple RF choke coils L7 and L8. The inductances $L_{eq1}$ and $L_{eq2}$ are used for biasing the drain terminals of the main and peaking transistors TR1 and TR2 and two dc blocking capacitors $C_{b1}$ and $C_{b2}$ are connected on the main and peaking transistors TR1 and TR2 branch for proper drain biasing of the Doherty power amplifier 1700.

The shunt inductance $L_{eq1}$ is the resultant of the shunt inductances $L_{11}$ in parallel with $L_{22}$ in FIG. 6A. The shunt inductance $L_{eq2}$ is the resultant of shunt inductances $L_{12}$ in parallel with $L_{32}$ in FIG. 6A. The shunt capacitance $C_{21}$ and inductance $L_{21}$ belongs to the harmonic terminating network of the main transistor TR1 as shown in FIG. 6A. The shunt capacitance $C_{31}$ and inductance $L_{31}$ belongs to the harmonic terminating network of the peaking transistor TR2 as shown in FIG. 6A. The transmission circuit TC here is a lumped inductor $L_0$ (e.g., MMIC inductor or bond wire) of the low pass π-type lumped quarter wave transmission line as the impedance inverting network, externally connecting the main transistor TR1's external drain terminal to the peaking transistor TR2's external drain terminal.

The LC compensation circuit is not shown in FIG. 7A, where L and C are in series, can be connected in series with the output branch of the main/peaking transistor as an optional structure for correcting improper harmonic load termination mistakes typically happen for class C biased peaking transistor TR2, for proper Doherty power amplifier load modulation.

The input power splitting is provided by the power splitter 1740 including the hybrid coupler 1741 and the high pass filters 1742 and 1743 which are input matching networks for the main and peaking amplifier.

Figure 7B:
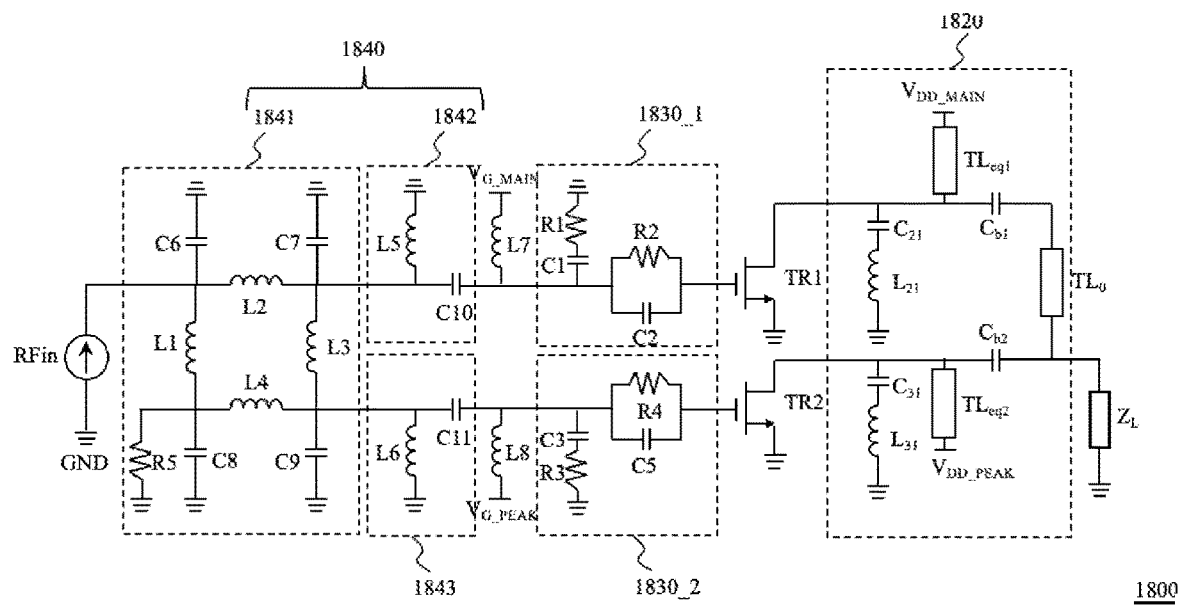
Figure 7C:
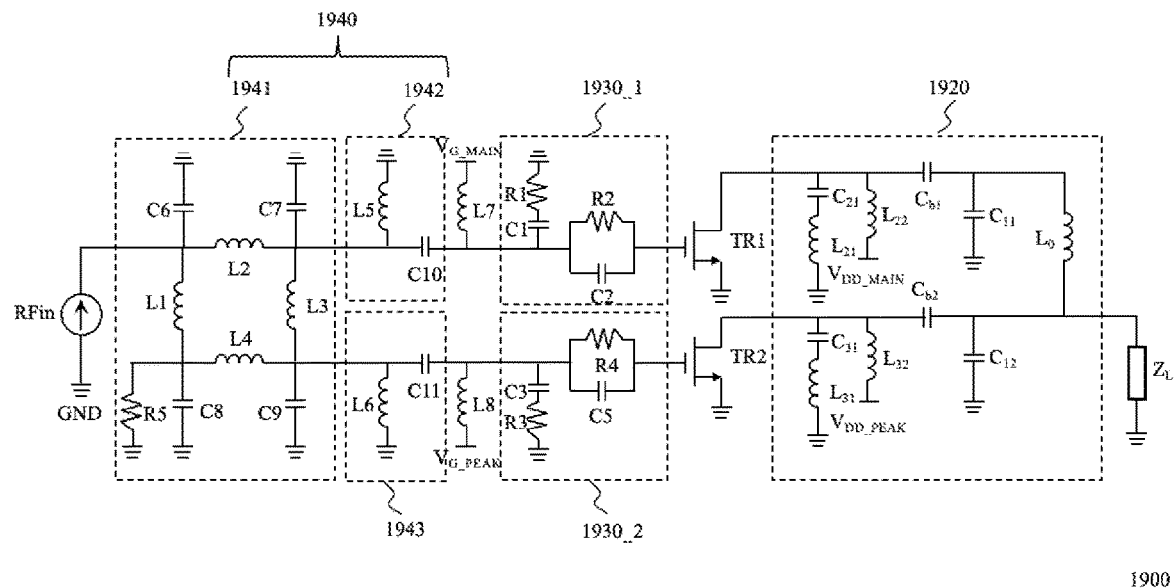
Figure 7D:
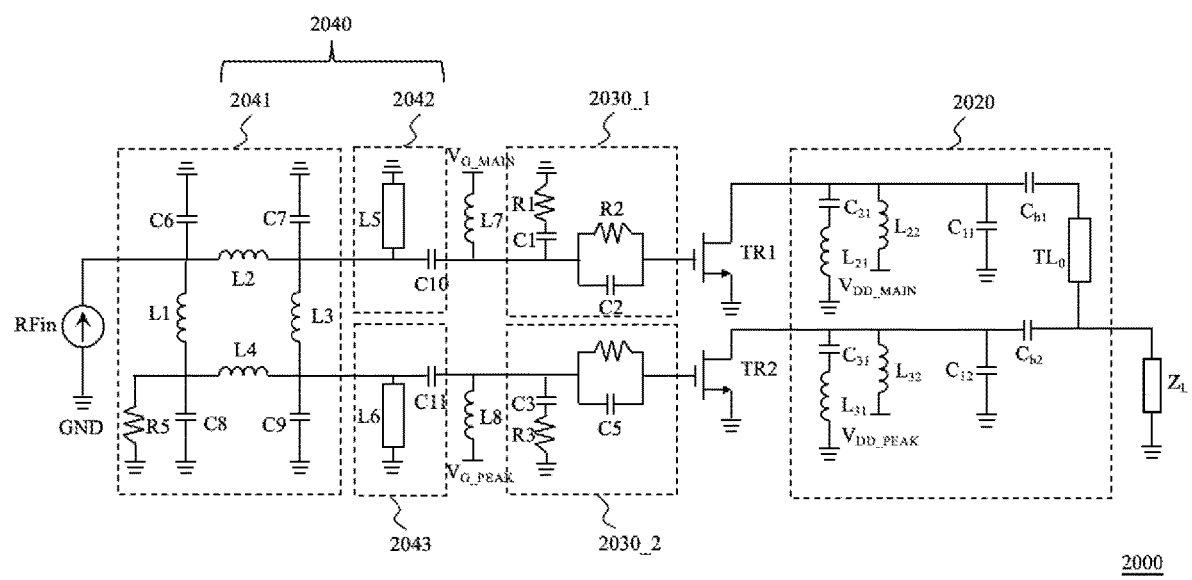

FIG. 7B-FIG. 7D demonstrate various embodiments of the Doherty power amplifier 1800/1900/2000 using different hybrid integrated matching circuit topologies 1820/1920/2020, which similar to those described in FIGS. 5A-5B and can be referred to the above description.

Figure 8A:
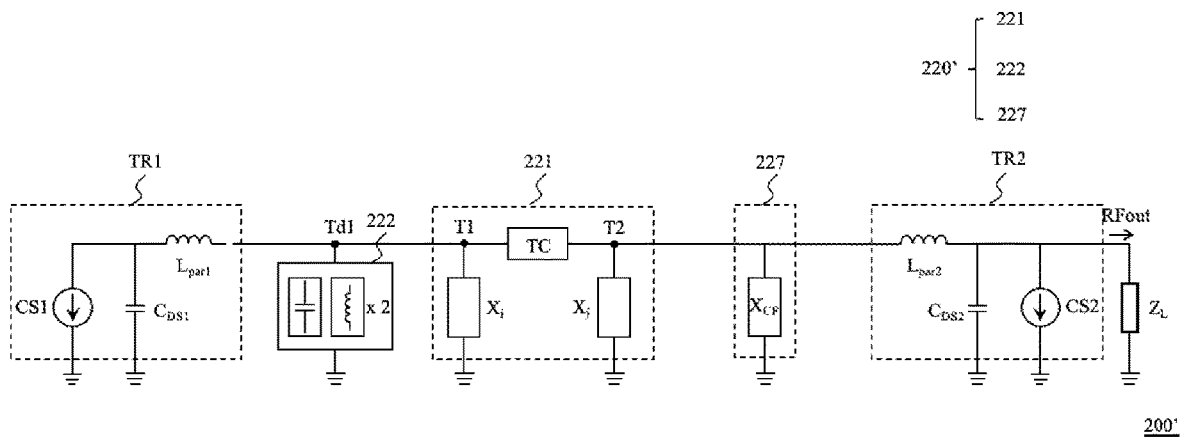
FIGS. 8A and 8B are schematic circuit diagrams of a RF power amplifier having a one-side hybrid integrated matching network according to some exemplary embodiments of FIG. 2B.
Figure 8B:
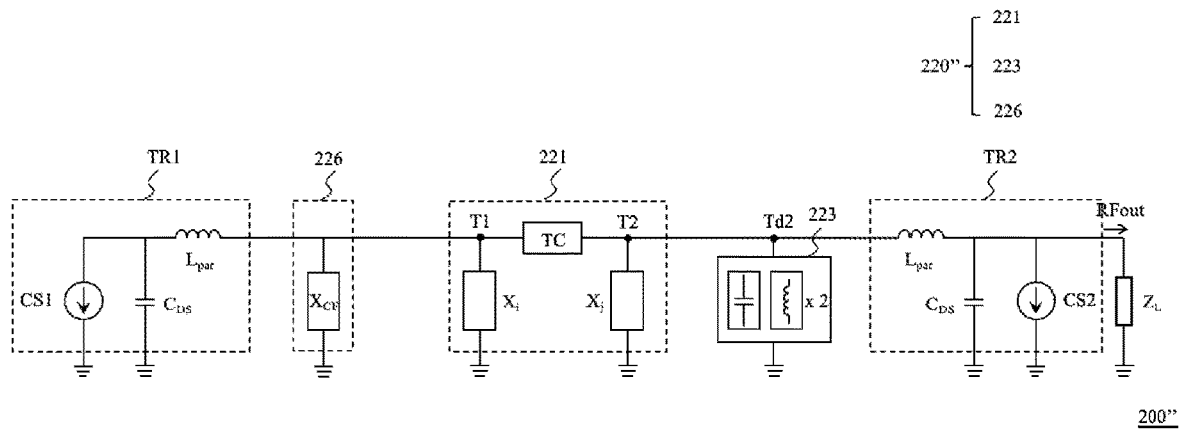

FIGS. 8A and 8B are schematic circuit diagrams of a RF power amplifier having a one-side hybrid integrated matching network according to some exemplary embodiments of FIG. 2B.

The One-Sided hybrid Integrated matching network uses either main transistor or peak transistor, but not both, output parasitic capacitance (drain to source capacitance $C_{DS}$, Miller capacitance between the drain and source of the devices) and output parasitic inductance (series drain inductance Lpar), for impedance inverting load modulating network and also providing harmonic load terminations such as second and third harmonic, (class F, $F^{-1}$, J or continuum class F, $F^{-1}$, J) for main and or peaking device operating as switch mode power amplifier.

Refer to FIG. 8A, the Doherty power amplifier 200' includes the main transistor TR1, the peaking transistor TR2, and the one-side hybrid integrated matching circuit 220', in which the one-side hybrid integrated matching circuit 220' includes the impedance inverter 221, the harmonic termination circuit 222, and the parasitic cancellation circuit 227.

The present embodiment is similar to those described in FIG. 5A, and thus the similar part will not be further repeated. The difference, compared to FIG. 5A, is that only the main transistor parasitic $C_{DS1}$ and $L_{par1}$ are used for the impedance inverting network design, and the parasitic cancellation circuit is introduced to cancel out the effect of the output parasitic at the peaking side.

To be specific, the impedance inverting network is using only main transistor output parasitic $C_{DS1}$ and $L_{par1}$, along with the shunt reactance $X_i$ and $X_j$ and series connected transmission circuit TC. The shunt reactance $X_i$ can be capacitive or inductive, based on the relationship of the main device parasitic capacitance $C_{DS1}$ and equivalent shunt capacitance value used of the low pass impedance inverting network.

The parasitic cancellation circuit 227 is connected between the drain terminal of the peaking transistor TR2 and the RF ground GND and configured to cancel out the effect of the parasitic component $C_{DS2}$ and $L_{par2}$ at the drain electrode of the peaking transistor TR2, and wherein the parasitic cancellation circuit 227 is an inductive type shunt component.

For example, the parasitic cancellation circuit 227 includes a shunt reactance $X_{CF}$ connected to the drain terminal of the peaking transistor TR2 to cancel out the effect of the peaking transistor output parasitic $C_{DS2}$ and $L_{par2}$ at the fundamental frequency.

Since the output parasitic of the peaking transistor TR2 has been cancelled by the shunt reactance $X_{CF}$, the impedance inverting network using only main transistor output parasitic can be regarded as the same as the impedance inverting network shown in FIG. 3B, which the shunt capacitor $C_{12}$ has the capacitance irrelevant to the peaking transistor output parasitic.

In the present embodiment, the parasitic cancellation circuit 227 can contributes as a part of the harmonic matching network for peaking transistor TR 2 if the peaking transistor is terminated with a harmonic terminating network as shown in FIG. 3C.

Refer to FIG. 8B, the Doherty power amplifier 200" includes the main transistor TR1, the peaking transistor TR2, and the one-side hybrid integrated matching circuit 220", in which the one-side hybrid integrated matching circuit 220" includes the impedance inverter 221, the harmonic termination circuit 223, and the parasitic cancellation circuit 226.

The present embodiment is similar to those described in FIG. 8A, and thus the similar part will not be further repeated. The difference, compared to FIG. 8A, is that the peaking transistor parasitic $C_{DS2}$ and $L_{par2}$ are used for the impedance inverting network design, and the parasitic cancellation circuit is changed to cancel out the effect of the output parasitic at the main side.

To be specific, the impedance inverting network is using only peaking device output parasitic $C_{DS2}$ and $L_{par2}$, along with the shunt reactance $X_i$ and $X_j$ and series connected transmission circuit TC. The shunt reactance $X_j$ can be capacitive or inductive, based on the relationship of the peaking device parasitic capacitance $C_{DS2}$ and equivalent shunt capacitance value used of the low pass impedance inverting network.

The parasitic cancellation circuit 226 is connected between the drain terminal of the main transistor TR1 and the RF ground GND and configured to cancel out the effect of the parasitic component $C_{DS1}$ and $L_{par1}$ at the drain electrode of the main transistor TR1, and wherein the parasitic cancellation circuit 226 is an inductive type shunt component.

Since the effect of the output parasitic of the main transistor TR1 has been cancelled by the shunt reactance $X_{CF}$, the impedance inverting network using only peaking transistor output parasitic can be regarded as the same as the impedance inverting network shown in FIG. 3B, by exchanging the definition of the terminals T1 and T2.

In the present embodiment, the parasitic cancellation circuit 226 contributes as a part of the harmonic matching network for main transistor TR 1 if the main transistor is terminated with a harmonic terminating network as shown in FIG. 3C.

FIGS. 9A-9E are schematic circuit diagrams of a RF power amplifier having a main-side hybrid integrated matching network according to some exemplary embodiments of the present disclosure.

Figure 9A:
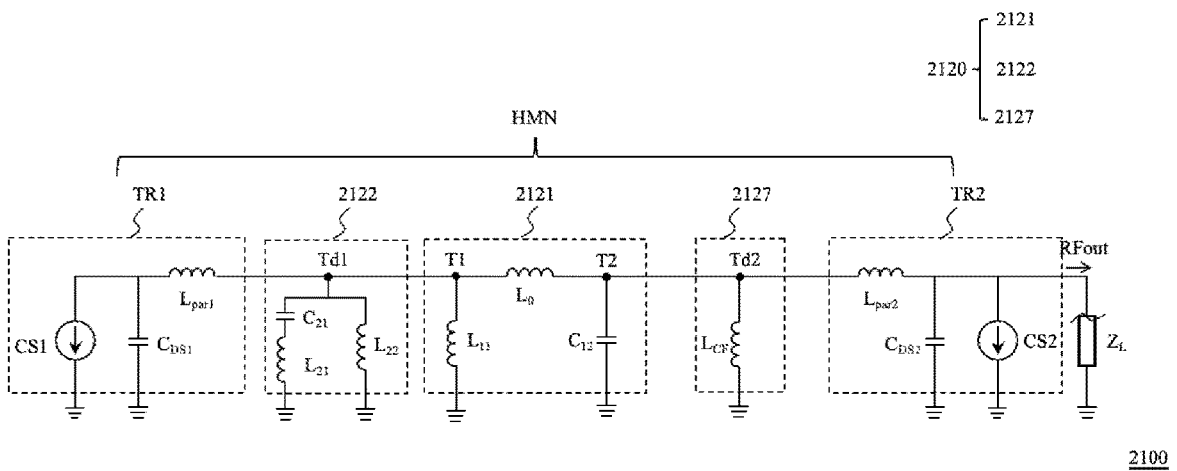
FIGS. 9A-9E are schematic circuit diagrams of a RF power amplifier having a main-side hybrid integrated matching network according to some exemplary embodiments of the present disclosure.

Refer to FIG. 9A, the Doherty power amplifier 2100 includes the main transistor TR1, the peaking transistor TR2, and the one-side hybrid integrated matching circuit 2120 using the main transistor output parasitic for the impedance inverting network. The one-side hybrid integrated matching circuit 2120 includes the impedance inverter 2121, the harmonic termination circuit 2122, and the parasitic cancellation circuit 2127.

The one-side hybrid integrated matching circuit 2120 is used for designing the load modulated Doherty power amplifier output stage. The first equivalent shunt capacitance of the low pass π-type lumped or reduced length quarter wave transmission line is implemented using the combination of the main transistor output parasitic $C_{DS1}$ and $L_{par1}$ and the shunt inductance $L_{11}$ on the main transistor side. The second equivalent shunt capacitance of the low pass π-type lumped or reduced length quarter wave transmission line is implemented directly by putting the shunt capacitor $C_2$ (e.g., $C_O$ or $C_{OT}$) on the peak transistor side. So, the equivalent capacitance $C_1$ (e.g., $C_O$ or $C_{OT}$) is formed at the main side by resonating out the main device output parasitic $C_{DS1}$ and $L_{par1}$ with inductance $L_{11}$ to get an equivalent capacitance $C_1$ at the main transistor side. The series transmission circuit TC connecting the extrinsic drain terminals of the main and the peaking transistor TR1 and TR2, could be an inductor or a transmission line based on whether the single stage low pass π-type lumped or reduced length quarter wave transmission line being implemented as the impedance inverting network.

The harmonic termination circuit 2122 for the main transistor TR1 includes the capacitance $C_{21}$ and the inductance $L_{21}$ connected in series, and the shunt inductance $L_{22}$ connected in parallel with the capacitance $C_{21}$ and the inductance $L_{21}$.

The harmonic matching network for the main transistor TR1 is formed using, the main transistor parasitic $C_{DS1}$ and $L_{par1}$, the harmonic termination circuit 2122, the shunt inductance $L_{11}$, the series inductance $L_0$, the shunt capacitance $C_{12}$, and the modulated load impedance $Z_{Lm}$ of the main amplifier. The shunt inductor $L_{CF}$ is connected to the drain terminal of the peaking transistor TR2 to cancel out the effect of the peaking transistor output parasitic $C_{DS2}$ and $L_{par2}$ at fundamental frequency.

Figure 9B:
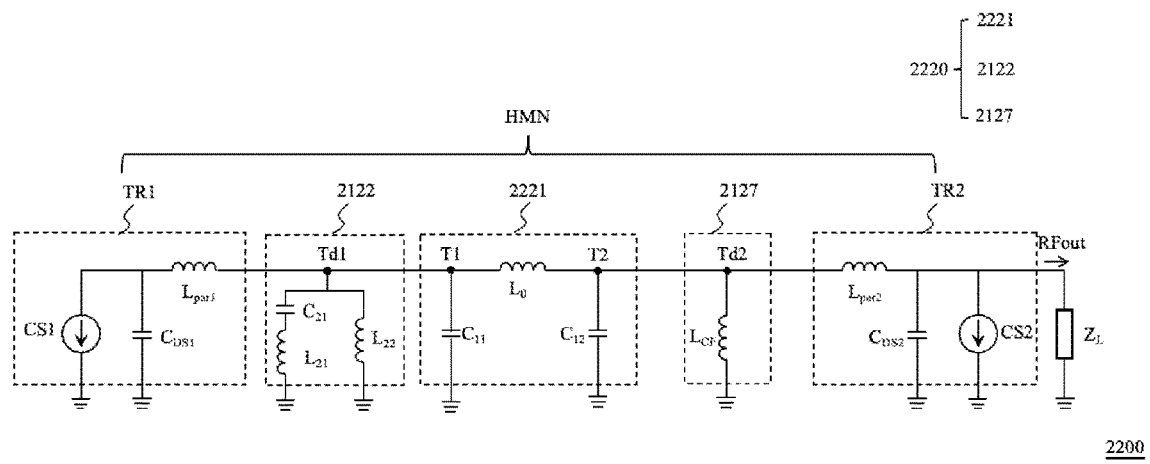

Refer to FIG. 9B, the Doherty power amplifier 2200 includes the main transistor TR1, the peaking transistor TR2, and the one-side hybrid integrated matching circuit 2220, in which the one-side hybrid integrated matching circuit 2220 includes the impedance inverter 2221, the harmonic termination circuit 2122, and the parasitic cancellation circuit 2127.

The present embodiment is similar to those described in FIG. 9A. The difference, compared to FIG. 9A, is that the inductance $L_{11}$ shown in FIG. 9A is replaced by the capacitance $C_{11}$ in the present embodiment. The similar part of the present embodiment can refer to those described in FIG. 9A, and thus will not be further repeated herein.

Figure 9C:
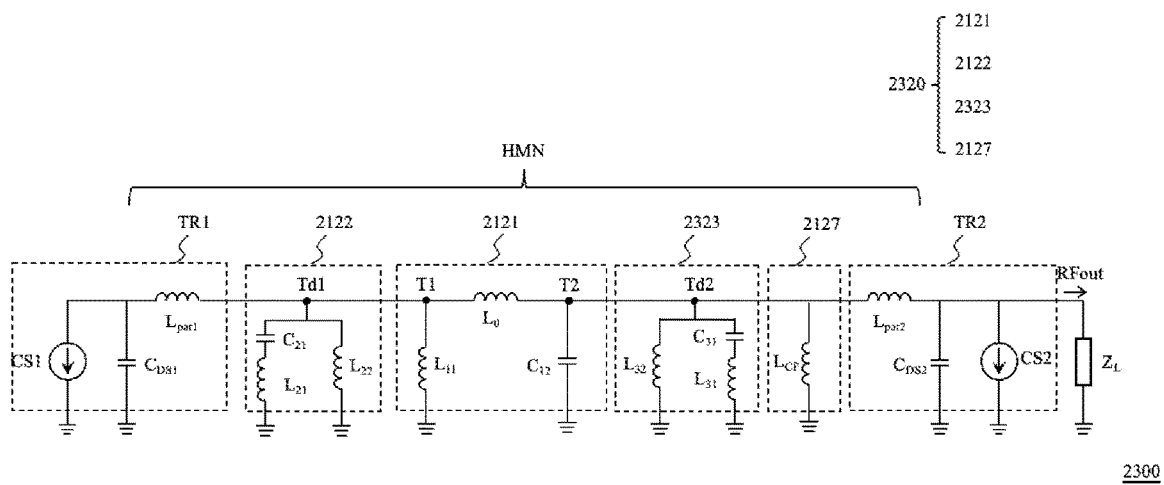

Refer to FIG. 9C, the Doherty power amplifier 2300 includes the main transistor TR1, the peaking transistor TR2, and the one-side hybrid integrated matching circuit 2320, in which the one-side hybrid integrated matching circuit 2320 includes the impedance inverter 2121, the harmonic termination circuits 2122 and 2323, and the parasitic cancellation circuit 2127.

The present embodiment is similar to those described in FIG. 9A. The difference, compared to FIG. 9A, is that the harmonic termination circuit 2323 for the peaking transistor TR2 is added in the present embodiment. The harmonic matching network for the peaking transistor TR2 here is formed using, the peaking transistor output parasitic $C_{DS2}$ and $L_{par2}$, the shunt inductance $L_{CF}$, the harmonic terminating circuit 2323, the shunt capacitance $C_{12}$, the series inductance $L_0$, a shunt inductance, and the modulated load impedance $Z_{L_p}$ at the output of the peaking amplifier. The similar part of the present embodiment can refer to those described in FIG. 9A, and thus will not be further repeated herein.

Figure 9D:
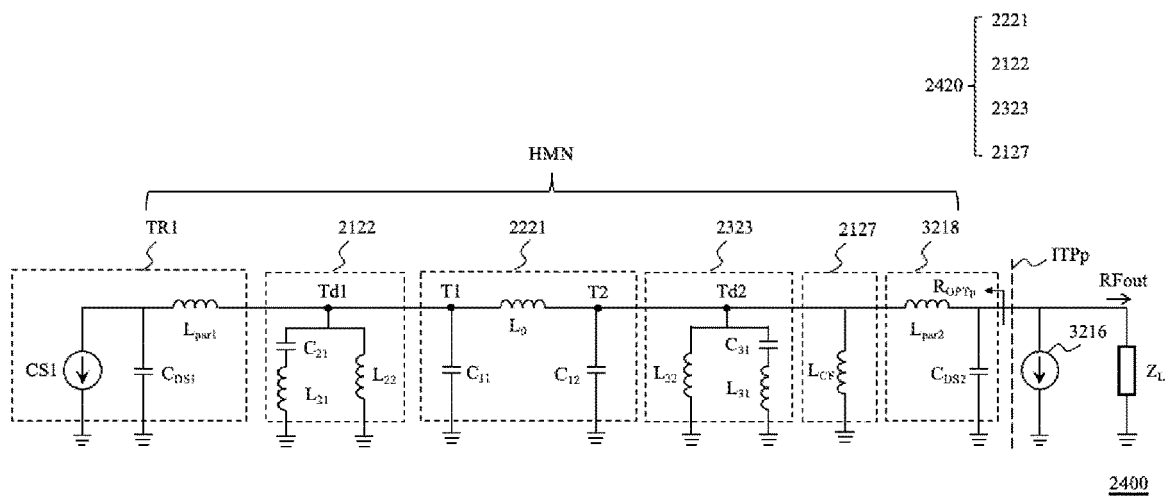

Refer to FIG. 9D, the Doherty power amplifier 2400 includes the main transistor TR1, the peaking transistor TR2, and the one-side hybrid integrated matching circuit 2420, in which the one-side hybrid integrated matching circuit 2420 includes the impedance inverter 2221, the harmonic termination circuits 2122 and 2323, and the parasitic cancellation circuit 2127.

The present embodiment is similar to those described in FIG. 9B. The difference, compared to FIG. 9B, is that the harmonic termination circuit 2323 for the peaking transistor TR2 is added in the present embodiment. The similar part of the present embodiment can refer to those described in FIG. 9B, and thus will not be further repeated herein.

Figure 9E:
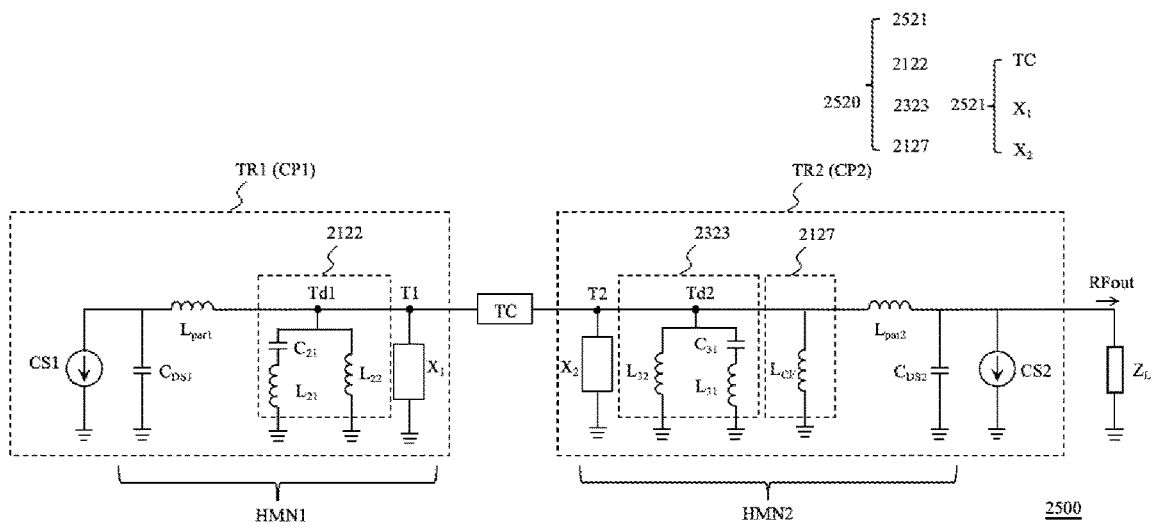

Refer to FIG. 9E, the Doherty power amplifier 2500 includes the main transistor TR1, the peaking transistor TR2, and the one-side hybrid integrated matching circuit 2520, in which the one-side hybrid integrated matching circuit 2520 includes the impedance inverter 2521, the harmonic termination circuits 2122 and 2323, and the parasitic cancellation circuit 2127.

Figure 6E:
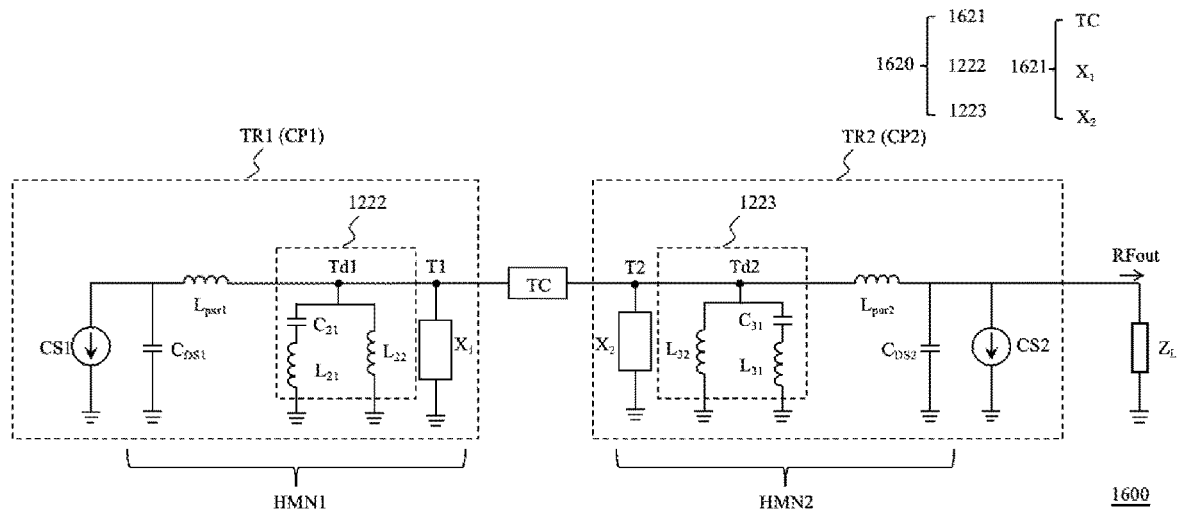

The present embodiment is similar to those described in FIG. 6E. The difference, compared to FIG. 6E, is that the parasitic cancellation circuit 2127 is added to cancel the effect of the peaking transistor's output parasitic in the present embodiment. The similar part of the present embodiment can refer to those described in FIG. 6E, and thus will not be further repeated herein.

Figure 10A:
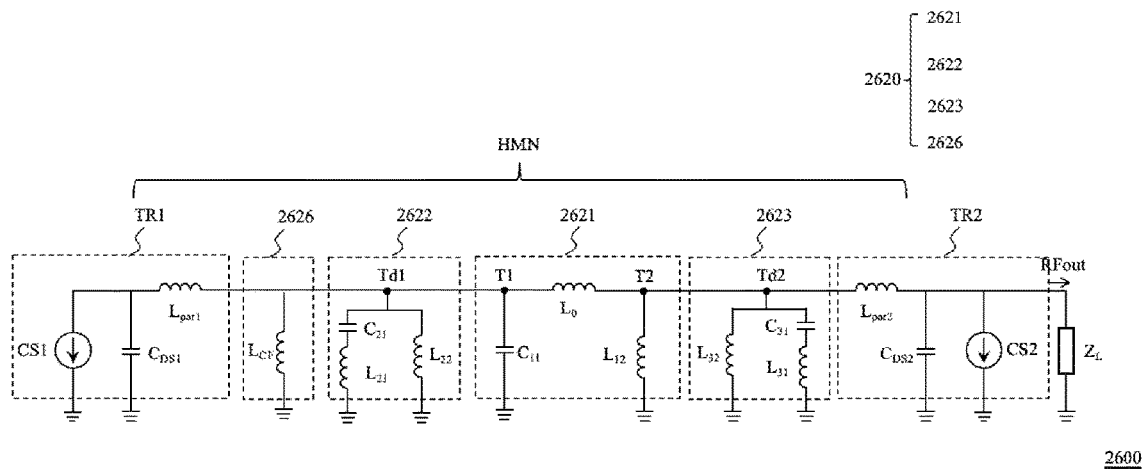
FIGS. 10A-10C are schematic circuit diagrams of a RF power amplifier having a peaking-side hybrid integrated matching network according to some exemplary embodiments of the present disclosure.
Figure 10B:
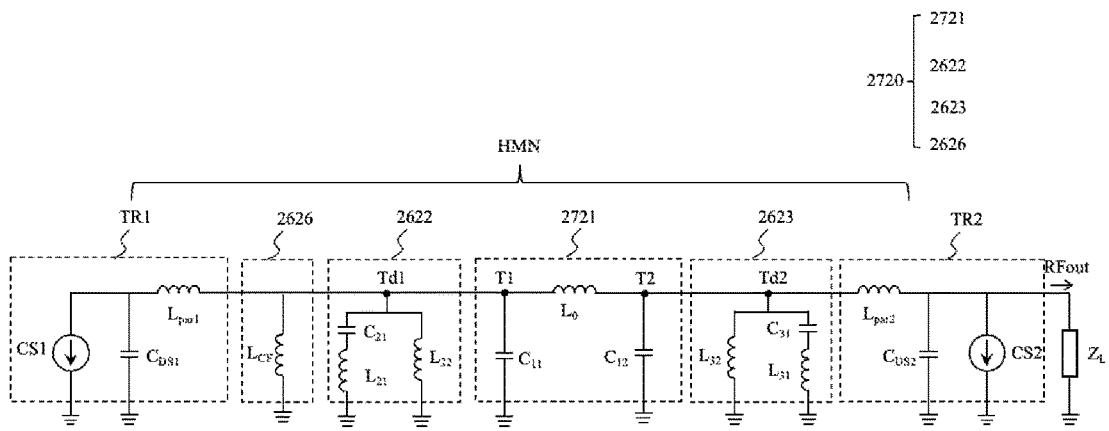
Figure 10C:
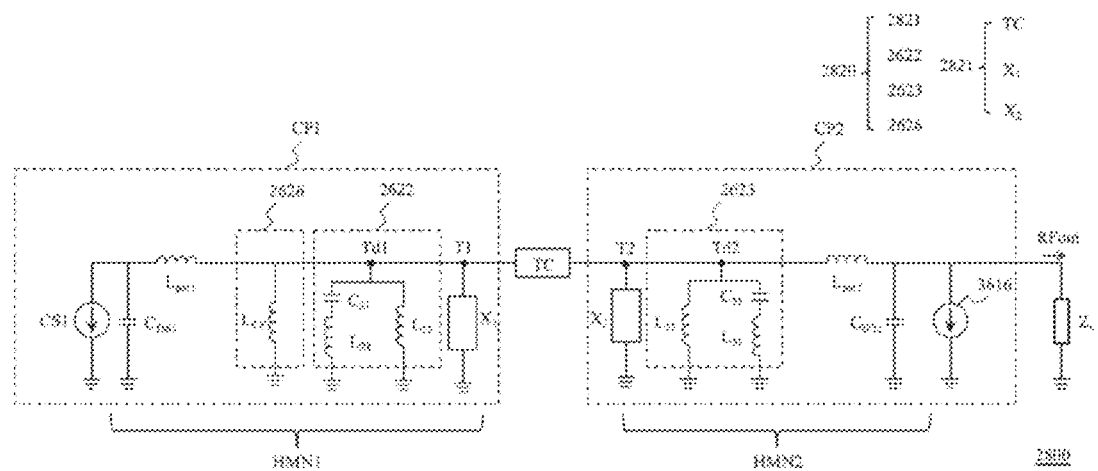

FIGS. 10A-10C are schematic circuit diagrams of a RF power amplifier having a peaking-side hybrid integrated matching network according to some exemplary embodiments of the present disclosure.

Refer to FIG. 10A, the Doherty power amplifier 2600 includes the main transistor TR1, the peaking transistor TR2, and the one-side hybrid integrated matching circuit 2620 using the peaking transistor output parasitic for the impedance inverting network. The one-side hybrid integrated matching circuit 2620 includes the impedance inverter 2621, the harmonic termination circuits 2622 and 2623, and the parasitic cancellation circuit 2626.

The one-Sided hybrid Integrated matching circuit 2620 is used for designing the load modulated Doherty power amplifier output stage. It is quite similar to the hybrid integrated matching circuit 2320 as shown in FIG. 9C, except that now only the peaking transistor output parasitic $C_{DS2}$ and $L_{par2}$ is used for impedance inversion and also for harmonic load termination simultaneously. Therefore, the circuit structure of the hybrid integrated matching circuit 2620 can be obtained by swapping the components of the main and peak amplifier of FIG. 9C to create FIG. 10A.

Refer to FIG. 10B, the Doherty power amplifier 2700 includes the main transistor TR1, the peaking transistor TR2, and the one-side hybrid integrated matching circuit 2720, in which the one-side hybrid integrated matching circuit 2720 includes the impedance inverter 2721, the harmonic termination circuits 2622 and 2623, and the parasitic cancellation circuit 2626.

The present embodiment is similar to those described in FIG. 10A. The difference, compared to FIG. 10A, is that the inductance $L_{12}$ shown in FIG. 10A is replaced by the capacitance $C_{12}$ in the present embodiment. The similar part of the present embodiment can refer to those described in FIG. 10A, and thus will not be further repeated herein.

Refer to FIG. 10C, the Doherty power amplifier 2800 includes the main transistor TR1, the peaking transistor TR2, and the one-side hybrid integrated matching circuit 2820, in which the one-side hybrid integrated matching circuit 2820 includes the impedance inverter 2821, the harmonic termination circuits 2622 and 2623, and the parasitic cancellation circuit 2626.

The present embodiment is similar to those described in FIG. 9E except that now only the peaking transistor output parasitic $C_{DS2}$ and $L_{par2}$ is used for impedance inversion and also for harmonic load termination simultaneously. Therefore, the circuit structure of the hybrid integrated matching circuit 2820 can be obtained by swapping the components of the main and peak amplifier of FIG. 9E to create FIG. 10C.

Figure 11:
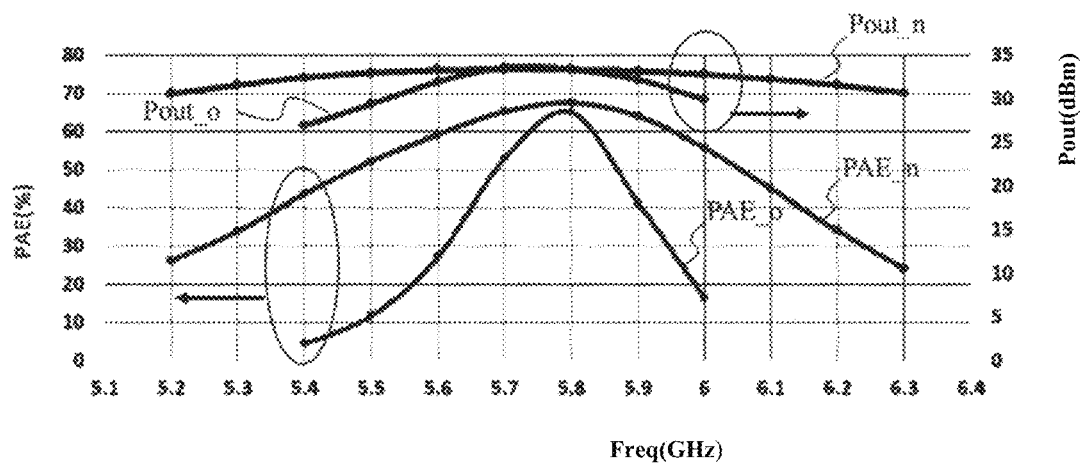
FIG. 11 is a performance chart of a comparison between typical Doherty power amplifier and a Doherty power amplifier having a hybrid integrated matching network.

FIG. 11 is a performance chart of a comparison between typical Doherty power amplifier employing harmonic terminations and a Doherty power amplifier having a hybrid integrated matching network.

Refer to FIG. 11, which shows the comparison between one of the invented hybrid Integrated Matching Network 1720 of the Doherty power amplifier 1700 as shown in FIG. 7A employing harmonic load termination using second and third harmonic loads, (here its class F harmonic termination) with the typical Doherty power amplifier also employing second and third harmonic load terminations (here its class F harmonic termination) for high efficiency. The large signal simulation results at 6 dB back off from peak power of Doherty power amplifier, for frequency sweep, clearly shows that there has been a significant improvement in the bandwidth by using the invented Doherty power amplifier compared to conventional. The peak power of both the invented and conventional Doherty power amplifier are kept constant for fair comparison. It is pointed out that the same improvement is seen when using other hybrid Integrated Networks for comparison.

The invented circuit gives 18-20% fractional bandwidth compared to the conventional circuit giving only 7-8% fractional bandwidth although both of them showed high 6 dB back off power added efficiency (about 66-68%) at operating frequency of 5.8 GHz with output power (around 33.4 dBm) using the GaN technology as an example to prove the importance of present invention. Technologies like III-V (GaAs or InP or GaN), Si, CMOS, SOI, SiGe and other semiconductor technology platform for MMIC, hybrid IC or discrete applications can also be used. The 6 dB back off power added efficiency curve PAE_n of the invented Doherty power amplifier and 6 dB back off power added efficiency curve PAE_o of the conventional Doherty power amplifier shows the remarkable difference with respect to the frequency sweep. The same is seen for 6 dB back off output power curve Pout_n of the invented Doherty power amplifier and 6 dB back off output power curve Pout_o of the conventional Doherty power amplifier with respect to frequency sweep.

In addition, corresponding to the input power back-off, the perfect 6 dB output power back off is provided for load modulation with Power Added Efficiency (PAE) hitting maximum value of 68.343%. The output power provides 38.933 dBm power at peak power and 32.881 dBm power at 6 dB back off from peak power. The power gain can be 7.31 dB gain at peak power and 9.294 dB gain at 6 dB back off from peak power.

The main transistor intrinsic drain voltage reaches the peak value of 55.618 V (almost twice the drain bias voltage for class F design) and has an almost square wave shape while the main transistor intrinsic drain current reaches peak value of 0.24 A and is almost half sinusoidal at 6 dB back off operation of Doherty power amplifier. The main transistor dynamic load line plotted against the DC load line shows the classical class F load line biased in class AB mode at 28 V. The peak transistor is about to turn on as its drain current peak is at 0.038 A and the dynamic load line biased in class C mode at 28 V is about to rise.

The main transistor intrinsic drain voltage peak value is 57.87 V (almost twice the drain bias voltage for class F design) and has an almost square wave shape while the main transistor intrinsic drain current reaches peak value of 0.55 A and is almost half sinusoidal with certain harmonics which started coming after peak power operation of Doherty power amplifier due to gain compression. The main transistor dynamic load line plotted against the DC load line shows the classis class F load line at peak operation of Doherty power amplifier biased in class AB mode at 28 V. The peak transistor intrinsic drain voltage has a peak value about 63.032 V (almost twice the peak drain bias voltage for class F design) and has an almost square wave shape while the peak transistor intrinsic drain current reaches peak value of 0.5 A and is almost half sinusoidal with certain harmonics which started coming after peak power operation due to gain compression. The peak transistor dynamic load line plotted against the DC load line curve shows close approximation to classical class F load line at peak operation of Doherty power amplifier biased in class C mode at 28 V.

Figure 12A:
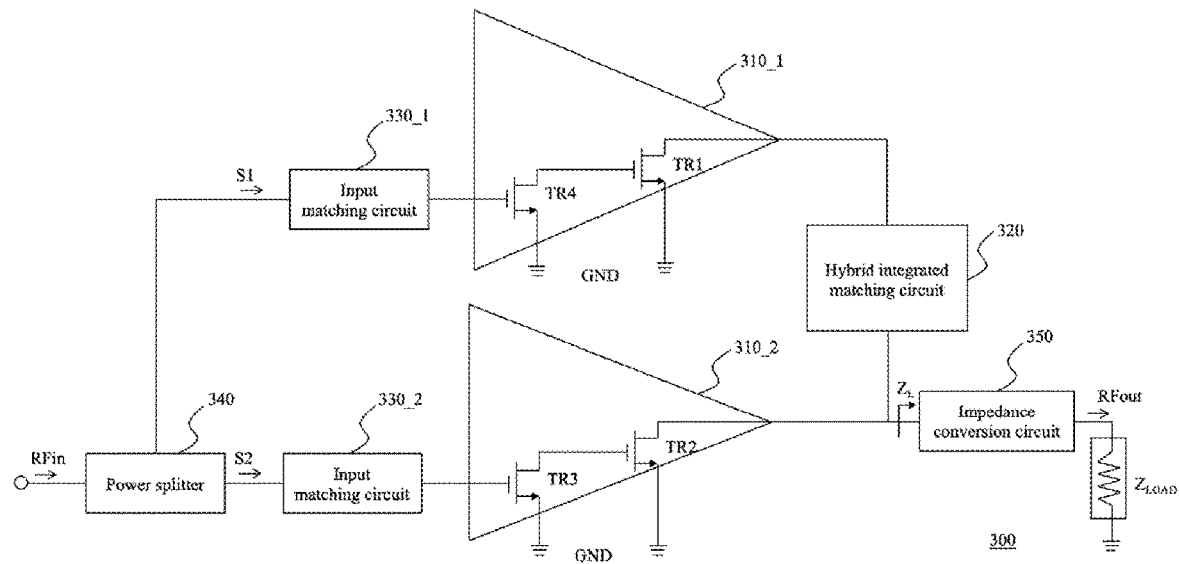
FIGS. 12A-12C are block diagrams of a Doherty power amplifier according to some exemplary embodiments of the present disclosure.
Figure 12B:
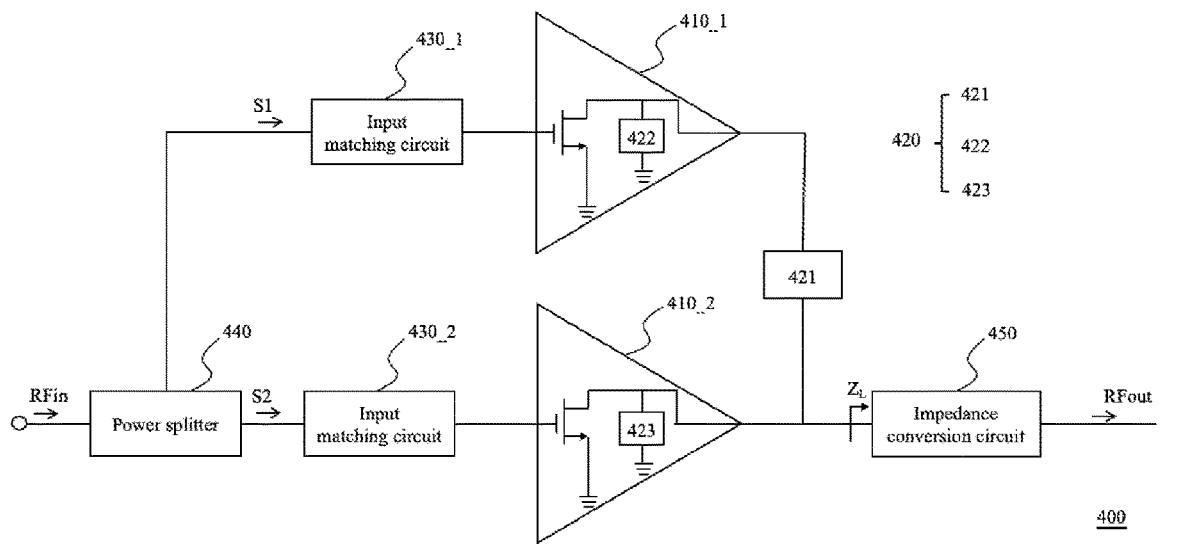
Figure 12C:
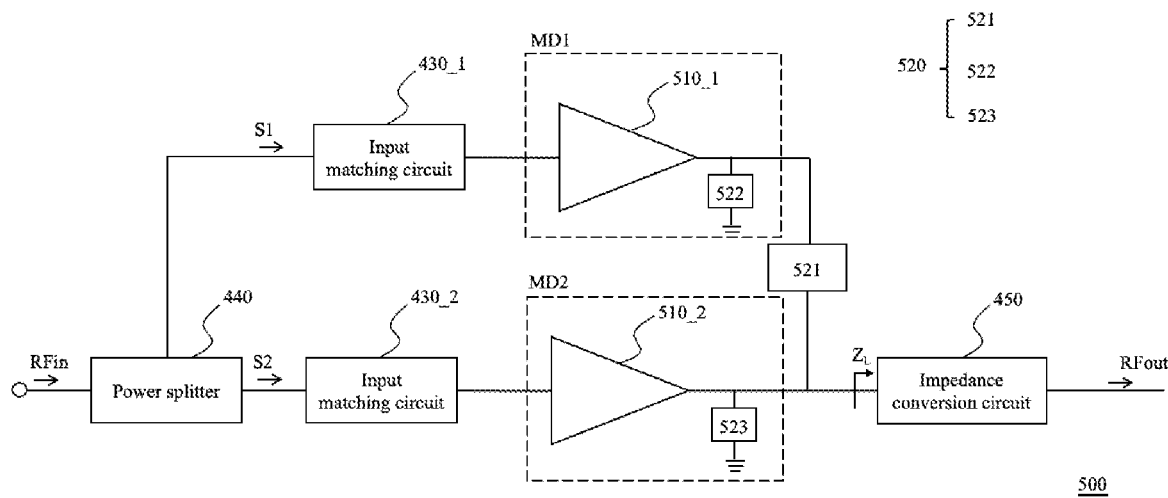

FIGS. 12A-12C are block diagrams of a Doherty power amplifier according to some exemplary embodiments of the present disclosure.

FIG. 12A shows another variation of the embodiments according to the present disclosure. A cascaded structure is used including a driver stage and a final stage in the main and peaking amplifier 310_1 and 310_2 design of the Doherty power amplifier 300.

Refer to FIG. 12A, the input matching circuits 330_1 and 330_2 of the driver stage main transistor TR4 and peaking transistor TR3 are used for gain enhancement and power matching. Similarly, there could be another input matching circuits disposed between the driver stage main transistor TR4 and the final stage main transistor TR1, and between the driver stage peaking transistor TR3 and the final stage peaking transistor TR2, which is not shown in the figure. The driver stage peaking transistor TR3 can be biased in class C while the final stage peaking transistor TR2 can be biased in class AB or B. This solves any lower gain problem and harmonic matching issues for the peaking amplifier usually biased in class C for Doherty power amplifier and provides proper load modulation required for Doherty power amplifier 300. The driver stage TR4 of the main amplifier 310_1 is biased in class AB or B. It is optional and can be used to provide high gain if required. The hybrid Integrated matching circuit 320 is used to provide impedance inversion of modulated load and harmonic load terminations (continuous or simple Switch Mode power amplifiers like class F, $F^{-1}$, J, etc.), and results better performance for the proposed Doherty power amplifier. The final stage peaking transistor TR2 can also be biased in class C for specific applications if required.

Refer to FIG. 12B, which shows another implementation of hybrid Integrated matching network where the main and peaking amplifiers 410_1 and 410_2 are internally matched, within the device, using the hybrid integrated matching circuit 420.

The Doherty power amplifier 400 includes a MMIC main amplifier device 410_1, a MMIC peaking amplifier device 410_2, the hybrid integrated matching circuit 420, the input matching circuit 430_1 and 430_2, the power splitter 440, and the impedance conversion circuit 450. Both devices 410_1 and 410_2 are internally matched, using the structures shown in FIG. 6E, FIG. 9E, and FIG. 10C, before putting them, with flip chip or without flip chip, on the PCB or any other substrate/carrier board. The series connected circuit 421 (which could be a bond wire or lumped inductor or microstrip line, or cascaded passive structures) is used to connect the MMIC chip main device drain terminal and peaking device drain terminal. The output of the RF power is connected to internally matched peaking device 410_2 drain terminal by an impedance conversion circuit 450. The impedance conversion circuit 450 is implemented on the substrate (PCB, laminate, interpose, etc). For the input side of the Doherty power amplifier 400, the RF input power RFin is split to the main and peaking amplifier 410_1 and 410_2 using input power splitter 440 (could be 90 hybrid splitter or lumped Wilkinson splitter or direct input power splitter, etc) in the manner that it provides proper Doherty load modulation and proper 6 dB back off.

Refer to FIG. 12C, which shows another implementation of hybrid Integrated matching network where the main and peaking amplifier devices are externally matched on MMIC die using a part of the hybrid Integrated matching network passive components.

In the present embodiment, the Doherty power amplifier 500 is the same as those in FIG. 12B except for the difference in implementation. The matching networks 522 and 523 of the hybrid integrated matching circuit 520 are connected externally to the main amplifier 510_1 and the peaking amplifier 510_2. The matching networks 522 and 523 belong to the hybrid Integrated matching circuit's passive components excluding the series transmission circuit 521 (which could be a bond wire or lumped inductor or microstrip line, or cascaded passive structures). The MMIC die MD1 for the main amplifier 510_1 and MMIC die MD2 for the peaking amplifier 510_2 are then attached to the Bottom substrate (PCB, laminate, Interpose, etc) and connected together with the series transmission circuit 521, as said before in the same manner it is done in FIG. 12B.

Figure 13:
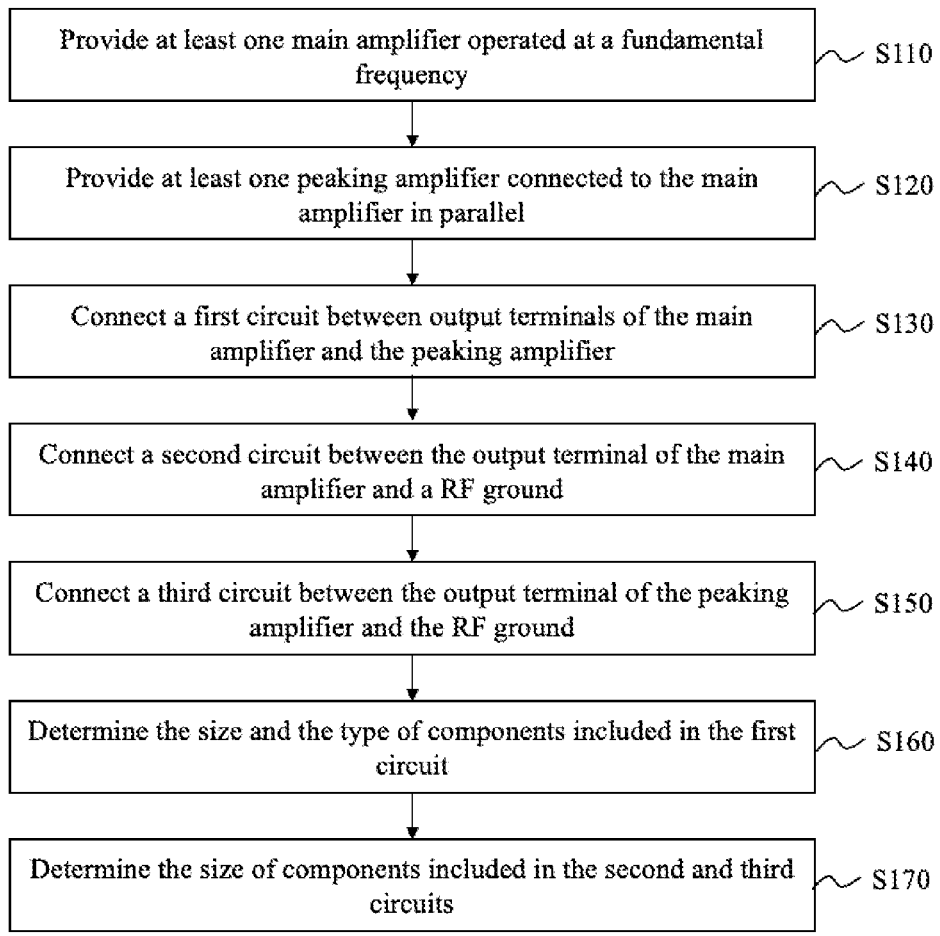
FIG. 13 is a flow chart of a method for manufacturing a Doherty power amplifier.

FIG. 13 is a flow chart of a method for manufacturing a Doherty power amplifier.

Refer to FIG. 13, the method for manufacturing a Doherty power amplifier can manufacture the Doherty power amplifier mentioned in the present disclosure. The method includes the following steps: providing at least one main amplifier operated at a fundamental frequency (S110); providing at least one peaking amplifier connected to the main amplifier in parallel (S120); connecting a first circuit between output terminals of the at least one main amplifier and the at least one peaking amplifier (S130); connecting a second circuit between the output terminal of the main amplifier and a RF ground (S140); connecting a third circuit between the output terminal of the peaking amplifier and the RF ground (S150); determining the size and the type of components included in the first circuit so as to design impedance inverting network using a parasitic component of at least one of the main amplifier and the peaking amplifier at the fundamental frequency (S160); determining the size of components included in the second circuit and the third circuit so that the second circuit and the third circuit presents a high impedance relative to the RF ground at the fundamental frequency and terminates at least one of the second harmonic and the third harmonic of the fundamental frequency (S170).

The above embodiments are intended merely to assist in understanding the present application. It can be understood that those having ordinary skills of the art may easily contemplate various changes and modifications of the technical solution and technical ideas of the present application. In summary, the contents in the specification should not be considered as a limitation of the present application.

What is claimed is:

1. A radio frequency (RF) power amplifier operated at a fundamental frequency and configured to electrically connect a load, comprising:
at least one transistor; and
a hybrid integrated matching circuit, electrically connected between an output terminal of the at least one transistor and the load, wherein the hybrid integrated matching circuit comprises:
a first circuit, having a first terminal electrically connected to the output terminal of the at least one transistor and a second terminal electrically connected to the load; and
a second circuit, electrically connected between the output terminal of the at least one transistor and a RF ground,
wherein at the fundamental frequency, the first circuit and an output parasitic component of the at least one transistor operate as an impedance inverter of the RF power amplifier, while the second circuit presents a high impedance path relative to the RF ground at the fundamental frequency, and
wherein the second circuit is configured to present an impedance relative to the RF ground such that one of a high impedance and a low impedance is observed from an intrinsic plane of the at least one transistor at a first target harmonic of the fundamental frequency to terminate the first target harmonic.

2. The RF power amplifier as claimed in claim 1, wherein the second circuit is further configured to present an impedance relative to the RF ground such that the other one of the high impedance and the low impedance is observed from the intrinsic plane of the at least one transistor at a second target harmonic of the fundamental frequency to terminate the second target harmonic.

3. The RF power amplifier as claimed in claim 2, wherein when the at least one transistor is a single transistor, a harmonic matching network for the single transistor is formed by at least the output parasitic component of the single transistor, the first circuit, and the second circuit; and when the at least one transistor is a plurality of transistors, a harmonic matching network for one of the transistors is formed by at least the output parasitic component of at least one of the transistors, the first circuit, and the second circuit.

4. The RF power amplifier as claimed in claim 2, wherein the first target harmonic is a second harmonic of the fundamental frequency, and the second target harmonic is a third harmonic of the fundamental frequency.

5. The RF power amplifier as claimed in claim 4, wherein the low impedance is observed from the intrinsic plane of the at least one transistor at the second harmonic of the fundamental frequency, and the high impedance is observed from the intrinsic plane of the at least one transistor at the third harmonic of the fundamental frequency.

6. The RF power amplifier as claimed in claim 2, wherein the impedance observed from an intrinsic plane of the at least one transistor is substantially irrelevant to the impedance presented, at the fundamental frequency, by the second circuit relative to the RF ground.

7. The RF power amplifier as claimed in claim 1, wherein the first circuit comprises:

a transmission circuit, electrically connected between the first terminal and the second terminal;
a first reactance component, electrically connected between one of the first terminal and the second terminal and the RF ground; and
a second reactance component, electrically connected between the other one of the first terminal and the second terminal and the RF ground.

8. The RF power amplifier as claimed in claim 7, wherein the transmission circuit comprises at least one of an inductor and a transmission line.

9. The RF power amplifier as claimed in claim 7, wherein the first reactance component comprises a first capacitor and the second reactance component comprises a second capacitor,
the first capacitor and the second capacitor are sized to meet below equation:

$$C_{11}=C_{12}-C_{DS};$$

where $C_{11}$ is the capacitance of the first capacitor, $C_{12}$ is the capacitance of the second capacitor, and $C_{DS}$ is the capacitance of the output parasitic component of the at least one transistor electrically connected to the first capacitor,
wherein when the at least one transistor is a single transistor, $C_{12}$ is calculated from a fundamental impedance at the intrinsic plane of the single transistor, and
wherein when the at least one transistor is a plurality of transistors, $C_{12}$ is calculated from a fundamental impedance at the intrinsic plane of one of the plurality of transistors.

10. The RF power amplifier as claimed in claim 7, wherein the first reactance component comprises a first inductor and the second reactance component comprises a second capacitor,
the first inductor and the second capacitor are sized to meet below equation:

$$L_{11} = \frac{1}{\omega_o^2(C_{DS} - C_{12})};$$

where $L_{11}$ is the inductance of the first inductor, $C_{12}$ is the capacitance of the second capacitor, $C_{DS}$ is the capacitance of the output parasitic component of the at least one transistor electrically connected to the first inductor, and $\omega_o$ is the fundamental frequency,
wherein when the at least one transistor is a single transistor, $C_{12}$ is calculated from a fundamental impedance at the intrinsic plane of the single transistor, and
wherein when the at least one transistor is a plurality of transistors, $C_{12}$ is calculated from a fundamental impedance at the intrinsic plane of one of the plurality of transistors.

11. The RF power amplifier as claimed in claim 7, wherein the second circuit comprises a capacitive component and two inductive components, and wherein the capacitive component is electrically connected to one of the inductive components in parallel and to the other one of the inductive components in series.

12. The RF power amplifier as claimed in claim 11, wherein the capacitive component and the inductive components comprise:
a first capacitive component;
a first inductive component, electrically connected to the first capacitive component in series and interposed between the output terminal of the at least one transistor and the RF ground; and a second inductive component, having one end electrically connected to the output terminal of the at least one transistor and to the first terminal and another end electrically connected to RF ground.

13. The RF power amplifier as claimed in claim 12, wherein the first capacitive component and the first inductive component are sized to present a low impedance path connecting to the RF ground at the first target harmonic of the fundamental frequency.

14. The RF power amplifier as claimed in claim 13, wherein the second inductive component is sized such that the first capacitive component, the first inductive component, and the second inductive component behave as an open circuit relative to RF ground at the fundamental frequency.

15. The RF power amplifier as claimed in claim 14, wherein the first capacitive component is a capacitor, each of the first inductive component and the second inductive component is implemented partly or fully by at least one of an inductor and a transmission line, and the capacitor, the inductor, and the transmission line of the second circuit are sized to meet below equation:

the first inductor and the second capacitor are sized to meet below equation:

$$L_{21}C_{21} = \frac{1}{(n\omega_0)^2};$$

$$L_{22} = \frac{(1 - \omega_0^2 L_{21} C_{21})}{\omega_0^2 C_{21}};$$

$$Z_{21}\tan(\theta_{21}) = \omega_0 L_{21};$$

$$Z_{22}\tan(\theta_{22}) = \omega_0 L_{22};$$

$$Z'_{21}\tan(\theta'_{21}) + \omega_0 L'_{21} = \omega_0 L_{21};$$

$$Z'_{22}\tan(\theta'_{22}) + \omega_0 L'_{22} = \omega_0 L_{21};$$

where $C_{21}$ is the capacitance of the capacitor which implements the first capacitive component, $L_{21}$ is the inductance of the inductor which implements the first inductive component, $L_{22}$ is the inductance of the inductor which implements the second inductive component, $Z_{21}$ is the characteristic impedance of the transmission line which implements the first inductive component whose value is $L_{21}$, $Z_{22}$ is the characteristic impedance of the transmission line which implements the second inductive component whose value is $L_{22}$, $\omega_o$ is the fundamental frequency, n is the index for $n^{th}$ harmonic number, $\theta_{21}$ is the electrical angle of the transmission line which implements the first inductive component whose value is $L_{21}$, and $\theta_{22}$ is the electrical angle of the transmission line which implements the second inductive component whose value is $L_{22}$, $Z_{21}'$ and $\theta_{21}'$ are the characteristic impedance and electrical angle of the transmission line which implements an inductive component which work together with inductor $L_{21}'$ to implement the first inductive component $L_{21}$, $Z_{22}'$ and $\theta_{22}'$ are the characteristic impedance and electrical angle of the transmission line which implements an inductive component which work together with inductor $L_{22}'$ to implement the second inductive component $L_{22}$.

16. The RF power amplifier as claimed in claim 12, wherein at least one of the first capacitive component, the first inductive component, and the second inductive component is directly connected to the output terminal of the at least one transistor.

17. The RF power amplifier as claimed in claim 16, wherein one of the first capacitive component, the first inductive component, and the second inductive component is disposed closest to the output terminal of the at least one transistor in the circuit layout.

18. The RF power amplifier as claimed in claim 3, wherein the hybrid integrated matching circuit further comprises:

a first compensation circuit, electrically connected between the first circuit and the second circuit and configured to compensate the harmonic matching network.

19. The RF power amplifier as claimed in claim 18, wherein the compensation circuit comprises:

a LC resonator, configured to resonate at the fundamental frequency.

20. The RF power amplifier as claimed in claim 1, further comprising:

an input matching circuit, electrically connected to an input terminal of the at least one transistor and configured to transmit a signal received from a power source to the input terminal of the at least one transistor.

21. The RF power amplifier as claimed in claim 1, wherein the at least one transistor comprises:

a first transistor; and a second transistor, electrically connected to the first transistor in parallel through the hybrid integrated matching circuit, wherein the first transistor and the second transistor are configured to share the load.

22. The RF power amplifier as claimed in claim 21, wherein the first terminal of the first circuit is electrically connected to the output terminal of the first transistor, and the second terminal of the first circuit is electrically connected to the output terminal of the second transistor.

23. The RF power amplifier as claimed in claim 22, wherein the second circuit has a terminal connected to the output terminal of one of the first and the second transistors and the other terminal connected to the RF ground, wherein the second circuit is configured to present an impedance relative to the RF ground such that the low impedance is observed from the intrinsic plane of the at least one transistor connected to the second circuit at the first target harmonic of the fundamental frequency to terminate the first target harmonic.

24. The RF power amplifier as claimed in claim 23, wherein the hybrid integrated matching circuit further comprises:

a third circuit, having a terminal connected to the output terminal of the other one of the first and the second transistors and the other terminal connected to the RF ground, and configured to present the high impedance path relative to the RF ground at the fundamental frequency and to present an impedance relative to the RF ground such that the one of the high impedance and the low impedance is observed from the intrinsic plane of the at least one transistor connected to the third circuit at the first target harmonic of the fundamental frequency to terminate the first target harmonic.

25. The RF power amplifier as claimed in claim 24, wherein the third circuit is further configured to present an impedance relative to the RF ground such that the other one of the high impedance and the low impedance is observed from the intrinsic plane of the at least one transistor connected to the third circuit at the second target harmonic of the fundamental frequency to terminate the second target harmonic.

26. The RF power amplifier as claimed in claim 24, wherein a harmonic matching network for the first transistor is formed by at least the output parasitic component of the first transistor, the first circuit, and one of the second circuit and the third circuit, and wherein a harmonic matching network for the second transistor is formed by at least the output parasitic component of the second transistor, the first circuit, and one of the second circuit and the third circuit.

27. The RF power amplifier as claimed in claim 24, wherein the second circuit and the third circuit comprise the same circuit topology.

28. The RF power amplifier as claimed in claim 24, wherein the first circuit and output parasitic components of the first and the second transistors operate as the impedance inverter of the RF power amplifier, while the second circuit and the third circuit present the high impedance path relative to the RF ground at the fundamental frequency.

29. The RF power amplifier as claimed in claim 24, wherein the first transistor operates as a main amplifier and the second transistor operates as a peaking amplifier.

30. The RF power amplifier as claimed in claim 24, wherein the first circuit comprises:
 a transmission circuit, electrically connected to the output terminal of the first transistor through the first terminal and to the output terminal of the second transistor through the second terminal;
 a first reactance component, electrically connected between the first terminal and the RF ground; and
 a second reactance component, electrically connected between the second terminal and the RF ground,
the second circuit and the third circuit comprises:
a first capacitive component;
a first inductive component, electrically connected to the first capacitive component in series and between the output terminal of the first transistor and the RF ground;
a second inductive component, having one end connected to the output terminal of the first transistor and first terminal and another end electrically connected to the RF ground;
a second capacitive component;
a third inductive component, electrically connected to the second capacitive component in series and between the output terminal of the second transistor and the RF ground; and
a fourth inductive component, having one end connected to the output terminal of second transistor and the second terminal and another end electrically connected to the RF ground.

31. The RF power amplifier as claimed in claim 30, wherein the impedance inverter is a quarter wave transmission line, and at the fundamental frequency, the value of a shared load is selected to be equal to half of a fundamental impedance at the intrinsic plane of the first transistor and the quarter wave transmission line is sized to have the characteristics impedance equal to the fundamental impedance at the intrinsic plane of the first transistor.

32. The RF power amplifier as claimed in claim 30, wherein each of the first reactance component and the second reactance component is implemented by one of a capacitor and an inductor, which are sized to meet below equation:

$$C_X = C_O - C_{DS};$$

$$L_X = \frac{1}{\omega_o^2 (C_{DS} - C_O)};$$

where $C_X$ is the capacitance of the capacitor which implements at least one of the first reactance component and the second reactance component, $C_O$ is the capacitance calculated from a fundamental impedance at intrinsic plane of the one of the first and second transistor, $C_{DS}$ is the capacitance of the output parasitic component of the at least one transistor connected to the corresponding first reactance component or second reactance component, Lx is the inductance of the inductor which implements at least one of the first reactance component and the second reactance component, and $\omega_o$ is the fundamental frequency.

33. The RF power amplifier as claimed in claim 30, wherein the first transistor, along with the first capacitive component, the first inductive component, the second inductive component, and the first reactance component are packaged in a first chip, and the second transistor, along with, the second capacitive component, the third inductive component, the fourth inductive component, and the second reactance component are packaged in a second chip, wherein the first chip and the second chip are externally connected to each other through the transmission circuit.

34. The RF power amplifier as claimed in claim 33, wherein the first chip and the second chip are disposed on a substrate.

35. The RF power amplifier as claimed in claim 33, wherein the components packaged in the first chip are externally matched with the first transistor, and the components packaged in the second chip are externally matched with the second transistor.

36. The RF power amplifier as claimed in claim 33, wherein the components packaged in the first chip are internally matched with the first transistor, and the components packaged in the second chip are internally matched with the second transistor.

37. The RF power amplifier as claimed in claim 30, wherein the transmission circuit comprises at least one of a bond wire, a transmission line, and an inductor.

38. The RF power amplifier as claimed in claim 25, wherein the hybrid integrated matching circuit further comprises:
 a parasitic cancellation circuit, connected between the output terminal of only one of the first and the second transistors and the RF ground and configured to cancel out the effect of the output parasitic component at the output terminal of the at least one transistor with which the parasitic cancellation circuit is connected, and wherein the parasitic cancellation circuit is an inductive type shunt component.

39. The RF power amplifier as claimed in claim 38, wherein the parasitic cancellation circuit is a part of the harmonic matching network for the at least one transistor with which the parasitic cancellation circuit is connected.

40. The RF power amplifier as claimed in claim 21, wherein at least one transistor further comprises:
 a third transistor, electrically connected to the second transistor in cascade, wherein the third transistor is biased in class C mode, and the second transistor is biased in class B, class AB, or class C mode.

41. The RF power amplifier as claimed in claim 40, wherein at least one transistor further comprises:
   a fourth transistor, electrically connected to the first transistor in cascade and biased in class AB or B mode.

42. The RF power amplifier as claimed in claim 1, wherein the impedance inverter comprises at least one of the following topologies: a low pass n stage lumped quarter wave transformer, a reduced length quarter wave transmission line, a quasi-lumped $n^{th}$ order low pass filter, a quasi-lumped $n^{th}$ order low pass quarter wave transformer, a quasi-lumped low pass Chebyshev transformer, a quasi-lumped low pass Chebyshev quarter wave transformer, quasi-lumped low pass quarter wave stepped impedance transformer and a quasi-lumped low pass quarter wave stepped impedance quarter wave transformer; wherein n is a natural number.

43. The RF power amplifier as claimed in claim 1, wherein the at least one transistor is a single transistor, the first circuit along with transistor parasitic component comprises a quarter wave transmission line used as impedance inverting network, and the quarter wave transmission line is sized to meet below equation:

$$Z_T = \sqrt{R_{OPT} * Z_{load}};$$

where $Z_T$ is the characteristics impedance of the quarter wave transmission line, $R_{OPT}$ is a fundamental impedance at the intrinsic plane of the single transistor, and $Z_{load}$ is the impedance of the load.

44. The RF power amplifier as claimed in claim 7, wherein the output terminal of the at least one transistor is biased by an inductive component from at least one of the first circuit and the second circuit, and wherein the inductive component is realized partly or fully by using at least one of a transmission line and an inductor.

45. The RF power amplifier as claimed in claim 38, wherein the output terminal of only one of the first and second transistors is biased by an inductive component from at least one of first circuit, second circuit and parasitic cancellation circuit, and wherein the inductive component is realized partly or fully by using at least one of a transmission line and an inductor.

46. The RF power amplifier as claimed in claim 1, wherein a fundamental operating frequency range starts from 0.3 GHz to 3000 GHz.

47. The RF power amplifier as claimed in claim 1, wherein at least one of the first and second circuit comprises a capacitive component implemented by at least one of a static capacitor and a tunable capacitor.

48. The RF power amplifier as claimed in claim 1, wherein the first circuit comprises:
   a first transmission line having one end electrically connected to the first terminal;
   a second transmission line, electrically connected between another end of the first transmission line and the RF ground; and
   a third transmission line having one end electrically connected to the first and the second transmission lines and another end electrically connected to the second terminal.

49. The RF power amplifier as claimed in claim 11, wherein the capacitive component and the inductive components comprise:
   a first inductive component; and
   an LC tank, electrically connected to the first inductive component in series and between the output terminal of the at least one transistor and the RF ground, wherein;
   the LC tank comprises a second inductive component and a first capacitive component electrically connected in parallel;
   wherein the first inductive component and the second inductive component are configured to present at least one of a second harmonic high impedance, a second harmonic low impedance, and a third harmonic low impedance at the intrinsic plane of the at least one transistor with which the second circuit is connected,
   wherein the second inductive component and first capacitive component are configured to present the high impedance path relative to the RF ground at fundamental frequency using the following equation:

$$L_{CH} C_{CH} = \frac{1}{(\omega_0)^2};$$

where $L_{CH}$ is the inductance of the second inductive component, $C_{CH}$ is the capacitance of the first capacitive component, and $\omega_o$ is the fundamental frequency.

50. The RF power amplifier as claimed in claim 1, wherein the at least one transistor is made of a semiconductor material having relatively large fundamental impedance at intrinsic plane.

51. The RF power amplifier as claimed in claim 1, wherein the second circuit includes a circuit topology configured to make the at least one transistor operate in a class F, a class F-1, a class J, a class S or a partial inverse class F mode.

52. A method for manufacturing a Doherty power amplifier, comprising:
   providing at least one first amplifier operated at a fundamental frequency; providing at least one second amplifier connected to the at least one first amplifier in parallel;
   connecting a first circuit between output terminals of the at least one first amplifier and the at least one second amplifier;
   connecting a second circuit between the output terminal of the at least one first amplifier and a RF ground;
   connecting a third circuit between the output terminal of the at least one second amplifier and the RF ground;
   determining the size and the type of components included in the first circuit so as to design impedance inverting network using an output parasitic component of at least one of the at least one first amplifier and the at least one second amplifier at the fundamental frequency;
   determining the size of components included in the second circuit and the third circuit so that the second circuit and the third circuit presents a high impedance relative to the RF ground at the fundamental frequency hence not affecting the functioning of impedance inverting network;
   determining the size of the components included in the second circuit and the third circuit so as to terminate one of a second harmonic and a third harmonic of the fundamental frequency by using at least the first circuit, the second circuit, and the third circuit presenting impedances such that one of a low impedance and a high impedance is observed from an intrinsic plane of the at least one first amplifier and the at least one second amplifier corresponding to that harmonic frequency; and
   determining the size of the components included in the second circuit and the third circuit so as to terminate the other one of the second harmonic and the third harmonic of the fundamental frequency by using at least the first circuit, the second circuit, and the third circuit presenting impedances such that one of a high impedance and a low impedance is observed from the intrinsic plane of the at least one first amplifier and the at least one second amplifier corresponding to that harmonic frequency.

53. The method for manufacturing a Doherty power amplifier as claimed in claim 52, wherein the first amplifier operates as a main amplifier and the second amplifier operates as a peaking amplifier.

54. The method for manufacturing a Doherty power amplifier as claimed in claim 52, wherein the second circuit or the third circuit includes a circuit topology configured to make at least one transistor operate in a class F, a class F-1, a class J, a class S or a partial inverse class F mode.

55. A radio frequency (RF) power amplifier operated at a fundamental frequency and configured to electrically connect a load, comprising:
at least one transistor;
a harmonic termination circuit, having one terminal directly connected to the output terminal of the at least one transistor and another terminal electrically connected to a RF ground, wherein the harmonic termination circuit contributes as a part of a harmonic matching network for the at least one transistor at least one of the second harmonic and the third harmonic of the fundamental frequency; and
an impedance inverter, having a first terminal electrically connected to the output terminal of the at least one transistor and a second terminal electrically connected to the load, and configured to perform impedance inversion of a static load or a modulated load at the fundamental frequency without affected by the harmonic termination circuit.

56. The RF power amplifier as claimed in claim 55, wherein the impedance inverter and an output parasitic component of the at least one transistor contribute as a part of an impedance inverting network for load modulation.

57. The RF power amplifier as claimed in claim 55, wherein at least the harmonic termination circuit, the impedance inverter, and the parasitic component of the at least one transistor contribute as a part of a harmonic matching network for the at least one transistor.

* * * * *